US012720786B2

(12) United States Patent
Kim et al.

(10) Patent No.: US 12,720,786 B2
(45) Date of Patent: Aug. 25, 2026

(54) SEMICONDUCTOR DEVICE AND METHOD OF MANUFACTURING SAME

(71) Applicant: SAMSUNG ELECTRONICS CO., LTD., Suwon-si (KR)

(72) Inventors: Kyungho Kim, Suwon-si (KR); Ki Hwan Kim, Suwon-si (KR); Kang Hun Moon, Suwon-si (KR); Choeun Lee, Suwon-si (KR); Yonguk Jeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 538 days.

(21) Appl. No.: 18/081,855

(22) Filed: Dec. 15, 2022

(65) Prior Publication Data

US 2023/0402535 A1 Dec. 14, 2023

(30) Foreign Application Priority Data

Jun. 8, 2022 (KR) ........................ 10-2022-0069384

(51) Int. Cl.
*H10D 30/43* (2025.01)
*H10D 30/67* (2025.01)
(Continued)

(52) U.S. Cl.
CPC ......... *H10D 30/43* (2025.01); *H10D 30/6735* (2025.01); *H10D 62/121* (2025.01); *H10D 64/258* (2025.01)

(58) Field of Classification Search
CPC .. H10D 30/43; H10D 30/6735; H10D 62/121; H10D 64/258
See application file for complete search history.

(56) References Cited

U.S. PATENT DOCUMENTS 9,608,066 B1 * 3/2017 Ando .................. H10D 64/691
10,243,060 B2 3/2019 Chao et al.
(Continued)

FOREIGN PATENT DOCUMENTS

KR 10-0707208 B1 4/2007
KR 10-2171135 B1 10/2020
TW 202119588 A 5/2021

OTHER PUBLICATIONS

Epitaxial Ald Beo: Efficient Oxygen Diffusion Barrier for EOT Scaling and Reliability Improvement, Jung Hwan Yum et al., IEEE Transactions on Electron Devices, vol. 58, No. 12, Dec. 2011.
(Continued)

*Primary Examiner* — Jay C Kim
*Assistant Examiner* — Woo K Lee
(74) *Attorney, Agent, or Firm* — Fish & Richardson P.C.

(57) ABSTRACT

A semiconductor device includes; a substrate including an active pattern, a channel pattern on the active pattern, the channel pattern including a plurality of spaced apart and vertically stacked semiconductor patterns, a source/drain pattern connected to the plurality of semiconductor patterns, a gate electrode on the plurality of semiconductor patterns, the gate electrode including a portion interposed between adjacent ones of the plurality of semiconductor patterns, and an inner spacer interposed between the portion of the gate electrode and the source/drain pattern, wherein the inner spacer is crystalline metal oxide is expressed by a formula (MO), wherein (O) is an oxygen atom, and (M) is a metal atom selected from a group consisting of Mg, Be, and Ga.

16 Claims, 34 Drawing Sheets

(51) Int. Cl.
*H10D 62/10* (2025.01)
*H10D 64/23* (2025.01)

(56) References Cited

U.S. PATENT DOCUMENTS

| | | | | |
|---|---|---|---|---|
| 10,483,378 | B2 | 11/2019 | Ching et al. | |
| 10,930,755 | B2 | 2/2021 | Hung et al. | |
| 2007/0145431 | A1 | 6/2007 | Kim et al. | |
| 2013/0285130 | A1 | 10/2013 | Ting et al. | |
| 2019/0148376 | A1* | 5/2019 | Chanemougame .......................... | H10D 30/6219 257/532 |
| 2021/0066477 | A1 | 3/2021 | Lee et al. | |
| 2021/0273047 | A1 | 9/2021 | Kuan et al. | |
| 2022/0037340 | A1* | 2/2022 | Yang ................. | H01L 21/02126 |
| 2022/0069135 | A1 | 3/2022 | Chu et al. | |

OTHER PUBLICATIONS

Epitaxial MgO as an Alternative Gate Dielectric for SiC Transistor Applications, A. Posadas et al., Applied Physics Letters 92, 233511 Mar. 1, 2008.

* cited by examiner

SEMICONDUCTOR DEVICE AND METHOD OF MANUFACTURING SAME

CROSS-REFERENCE TO RELATED APPLICATION

This U.S. non-provisional patent application claims priority under 35 U.S.C. § 119 to Korean Patent Application No. 10-2022-0069384 filed on Jun. 8, 2022 in the Korean Intellectual Property Office, the subject matter of which is hereby incorporated by reference in its entirety.

BACKGROUND

The inventive concept relates generally to semiconductor devices and methods of manufacturing same. More particularly, the inventive concept relates to semiconductor devices including a field effect transistor and methods of manufacturing same.

Many semiconductor devices include various integrated circuit(s) that may include metal oxide semiconductor (MOS) field effect transistors (FET). As the physical size and design rule for semiconductor devices have gradually been reduced, a corresponding scale down in MOSFETs has followed. However, reduction in the size of MOSFETs tends to adversely effect certain operating characteristics of semiconductor devices. Accordingly, various methods of manufacturing semiconductor devices providing superior performance while overcoming limitations due to high integration of the semiconductor device have been studied.

SUMMARY

Embodiments of the inventive concept provide semiconductor devices exhibiting improved reliability and excellent electrical characteristics, while other embodiments of the inventive concept provide methods of manufacturing such semiconductor devices.

A semiconductor device according to embodiments of the inventive concept may include; a substrate including an active pattern, a channel pattern on the active pattern, the channel pattern including a plurality of semiconductor patterns, a source/drain pattern connected to the plurality of semiconductor patterns, a gate electrode on the plurality of semiconductor patterns, the gate electrode including a portion interposed between adjacent ones of the plurality of semiconductor patterns, and an inner spacer interposed between the portion of the gate electrode and the source/drain pattern, wherein the inner spacer is crystalline metal oxide is expressed by a formula (MO), wherein (O) is an oxygen atom, and (M) is a metal atom selected from a group consisting of Mg, Be, and Ga.

A semiconductor device according to embodiments of the inventive concept may include; a substrate including an active pattern, a channel pattern on the active pattern, wherein the channel pattern includes a plurality of semiconductor patterns, a source/drain pattern connected to the plurality of semiconductor patterns, a gate electrode on the plurality of semiconductor patterns, wherein the gate electrode includes a portion interposed between adjacent ones of the plurality of semiconductor patterns, and an inner spacer interposed between the portion of the gate electrode and the source/drain pattern, wherein the inner spacer includes crystalline metal oxide, and a metal atom of the inner spacer and a silicon atom of the source/drain pattern are covalently bonded at an interface between the inner spacer and the source/drain pattern.

A semiconductor device according to embodiments of the inventive concept may include; a substrate including an active region, a device isolation layer defining an active pattern on the active region, a channel pattern and a source/drain pattern on the active pattern, wherein the channel pattern includes a plurality of semiconductor patterns, a gate electrode on the plurality of semiconductor patterns, the gate electrode including a portion interposed between adjacent semiconductor patterns among the plurality of semiconductor patterns, a gate insulating layer between the adjacent semiconductor patterns and the portion of the gate electrode, an inner spacer between the gate insulating layer and the source/drain pattern, a gate spacer on a sidewall of the gate electrode, a gate capping pattern on an upper surface of the gate electrode, an interlayer insulating layer on the gate capping pattern, an active contact electrically connected to the source/drain pattern through the interlayer insulating layer, a metal-semiconductor compound layer interposed between the active contact and the source/drain pattern, a gate contact passing through the interlayer insulating layer and the gate capping pattern to be electrically connected to the gate electrode, a first metal layer on the interlayer insulating layer, the first metal layer including a power wiring, and first wirings electrically connected to the active contact and the gate contact, respectively, and a second metal layer on the first metal layer, wherein the second metal layer includes second wirings electrically connected to the first metal layer, and the inner spacer includes crystalline metal oxide of a face-centered cubic structure (FCC).

A method of manufacturing a semiconductor device according to embodiments of the inventive concept may include; forming a stacked pattern on a substrate, the stacked pattern including alternately stacked active layers and sacrificial layers, forming a sacrificial pattern extending in a first direction on the stacked pattern, etching the stacked pattern using the sacrificial pattern as a mask to form a recess in the stacked pattern, wherein the active layers including a plurality of semiconductor patterns is exposed by the recess, performing a selective etching process on the sacrificial layers exposed by the recess to form indent regions, forming an epitaxial dielectric layer filling the indent regions using the exposed sacrificial layers as seeds, the epitaxial dielectric layer including crystalline metal oxide, wet etching the epitaxial dielectric layer to form respective inner spacers in the indent regions, performing a selective epitaxial growth process using the plurality of semiconductor patterns and the inner spacers as exposed by the recess as seeds to form source/drain pattern filling the recess, removing the sacrificial pattern and the sacrificial layers to expose the plurality of semiconductor patterns, and sequentially forming a gate insulating layer and a gate electrode on the exposed plurality of semiconductor patterns.

BRIEF DESCRIPTION OF THE DRAWINGS

Advantages, benefits and features, as well as the making and use of the inventive concept will be more clearly understood upon consideration of the following detailed description together with the accompanying drawings, in which:

FIGS. 7A, 8A, 9A, 10A, 11A, and 12A are cross-sectional views corresponding to line A-A' of FIG. 4; FIGS. 9B and 10B are cross-sectional views corresponding to line B-B' of FIG. 4; FIGS. 9C, 10C, 11B, and 12B are cross-sectional views corresponding to line C-C' of FIG. 4; and FIGS. 7B, 8B, 11C and 12C are cross-sectional views corresponding to line D-D' of FIG. 4;

DETAILED DESCRIPTION

Throughout the written description and drawing, like reference numbers and labels are used to denote like or similar elements, components, features and/or method steps.

Figure 1:
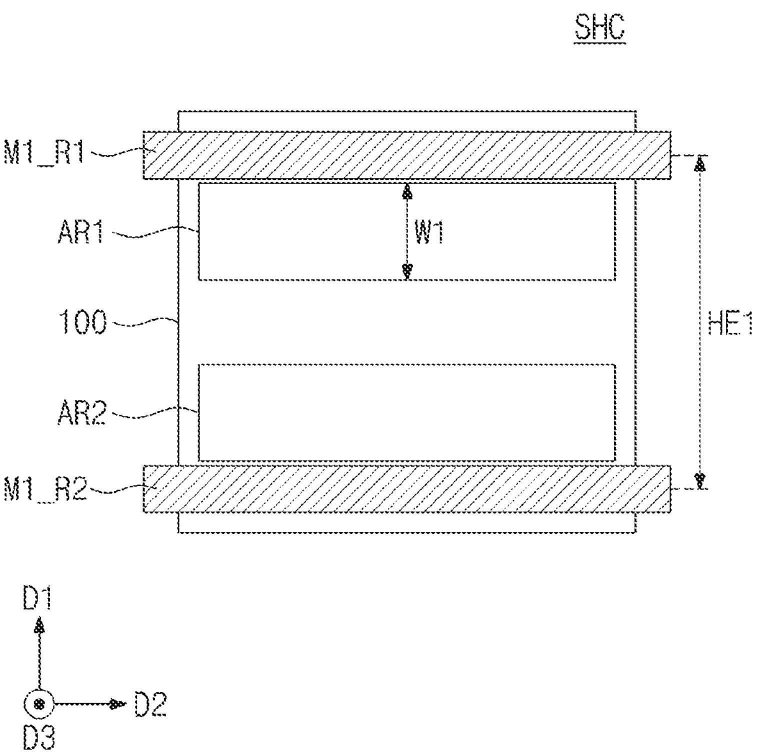
FIGS. 1, 2 and 3 are respective block diagrams illustrating logic cells of a semiconductor device according to embodiments of the inventive concept.
Figure 2:
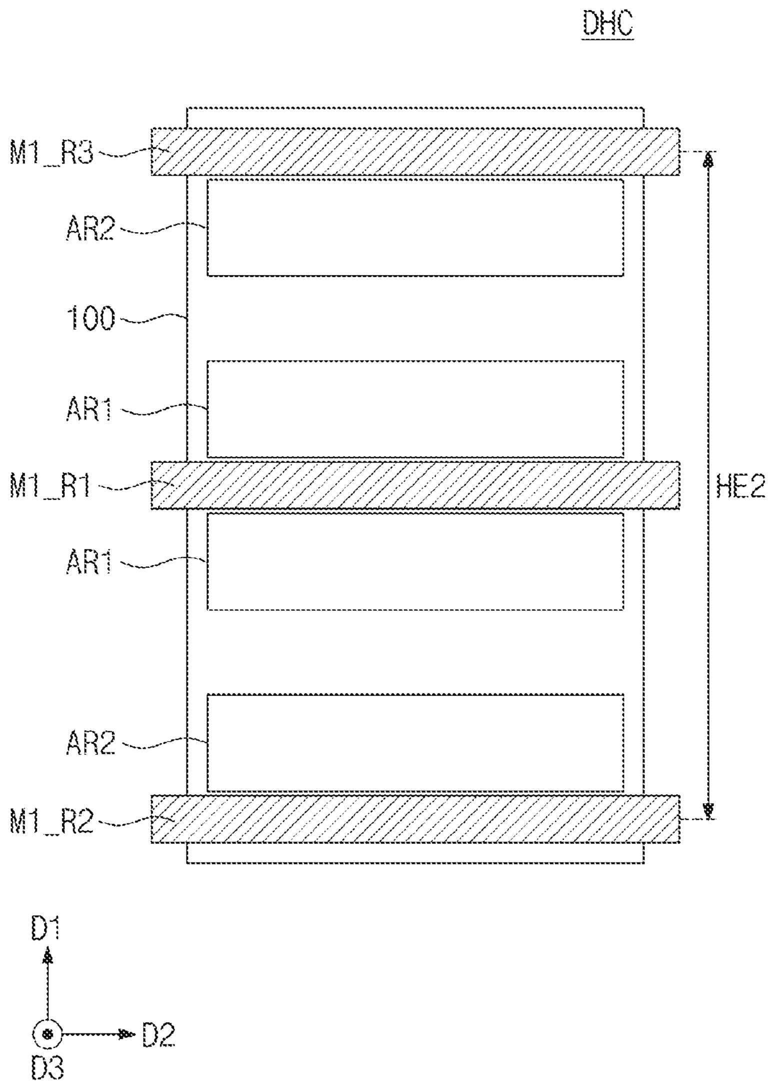
Figure 3:
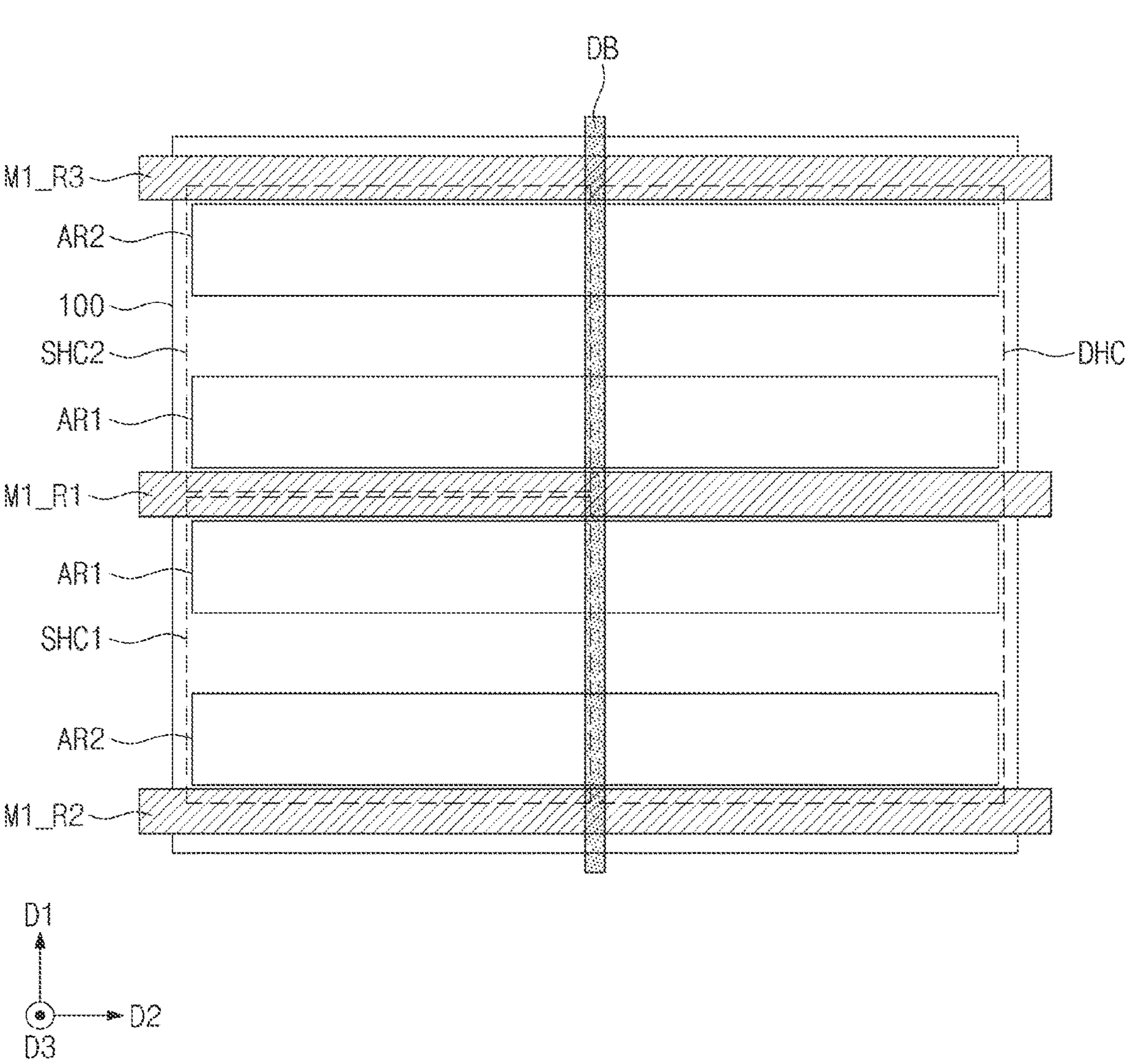

FIGS. 1, 2 and 3 are respective block diagrams illustrating logic cells of a semiconductor device according to embodiments of the inventive concept.

FIG. 1 shows a single height cell SHC. Here, a first power wiring M1_R1 and a second power wiring M1_R2 may be provided on a substrate 100. The first power wiring M1_R1 may be a path through which a source voltage (e.g., VSS) or a ground voltage is provided. The second power wiring M1_R2 may be a path through which a drain voltage (e.g., VDD) or a power voltage is provided.

The single height cell SHC may be defined between the first power wiring M1_R1 and the second power wiring M1_R2. The single height cell SHC may include one first active region AR1 and one second active region AR2. One of the first and second active regions AR1 and AR2 may be a P-type MOSFET (PMOSFET) region, and the other of the first and second active regions AR1 and AR2 may be an N-type MOSFET (or NMOSFET) region. That is, the single height cell SHC may have a CMOS structure provided between the first power wiring M1_R1 and the second power wiring M1_R2.

Each of the first and second active regions AR1 and AR2 may have a first width W1 in a first direction D1. A length of the single height cell SHC in the first direction D1 may be defined as a first height HE1. The first height HE1 may be substantially equal to a distance (e.g., a pitch) between the first power wiring M1_R1 and the second power wiring M1_R2.

The single height cell SHC may constitute one logic cell, such as for example, a logic component capable of performing a logical function such as an AND, an OR, an XOR, an XNOR or an inverter function. In this regard, the logic cell may include one or more transistor(s) collectively implementing the logic device as well as various wirings connecting the transistor(s).

FIG. 2 shows a double height cell DHC. Gere, a first power wiring M1_R1, a second power wiring M1_R2, and a third power wiring M1_R3 may be provided on the substrate 100. The first power wiring M1_R1 may be disposed between the second power wiring M1_R2 and the third power wiring M1_R3, wherein the third power wiring M1_R3 may be a path through which a source voltage (e.g., VSS) is provided.

The double height cell DHC may be defined between the second power wiring M1_R2 and the third power wiring M1_R3. The double height cell DHC may include two first active regions AR1 and two second active regions AR2.

One of the two second active regions AR2 may be adjacent to the second power wiring M1_R2. The other of the two second active regions AR2 may be adjacent to the third power wiring M1_R3. The two first active regions AR1 may be adjacent to the first power wiring M1_R1, respectively. The first power wiring M1_R1 may be disposed between the two first active regions AR1.

A length of the double height cell DHC in a first direction D1 may be defined as a second height HE2. The second height HE2 may be about twice the first height HE1. The two first active regions AR1 of the double height cell DHC may be grouped to operate as a single active region. In some embodiments, the double height cell DHC may be defined as a multi-height cell. Although not shown in FIG. 2, the multi-height cell may include a triple-height cell having a cell height about three times that of the single height cell SHC.

FIG. 3 shows a first single height cell SHC1, a second single height cell SHC2, and a double height cell DHC—as two-dimensionally disposed on the substrate 100. The first single height cell SHC1 may be disposed between first and second power wirings M1_R1 and M1_R2. The second single height cell SHC2 may be disposed between first and third power wirings M1_R1 and M1_R3. The second single height cell SHC2 may be adjacent to the first single height cell SHC1 in the first direction D1.

The double height cell DHC may be disposed between the second and third power wirings M1_R2 and M1_R3. The double height cell DHC may be adjacent to the first and second single height cells SHC1 and SHC2 in a second direction D2 substantially orthogonal to the first direction D1.

A separation structure DB may be provided between the first single height cell SHC1 and the double height cell DHC and between the second single height cell SHC2 and the double height cell DHC. An active region of the double height cell DHC may be electrically separated from an active region of each of the first and second single height cells SHC1 and SHC2 by the separation structure DB.

Figure 4:
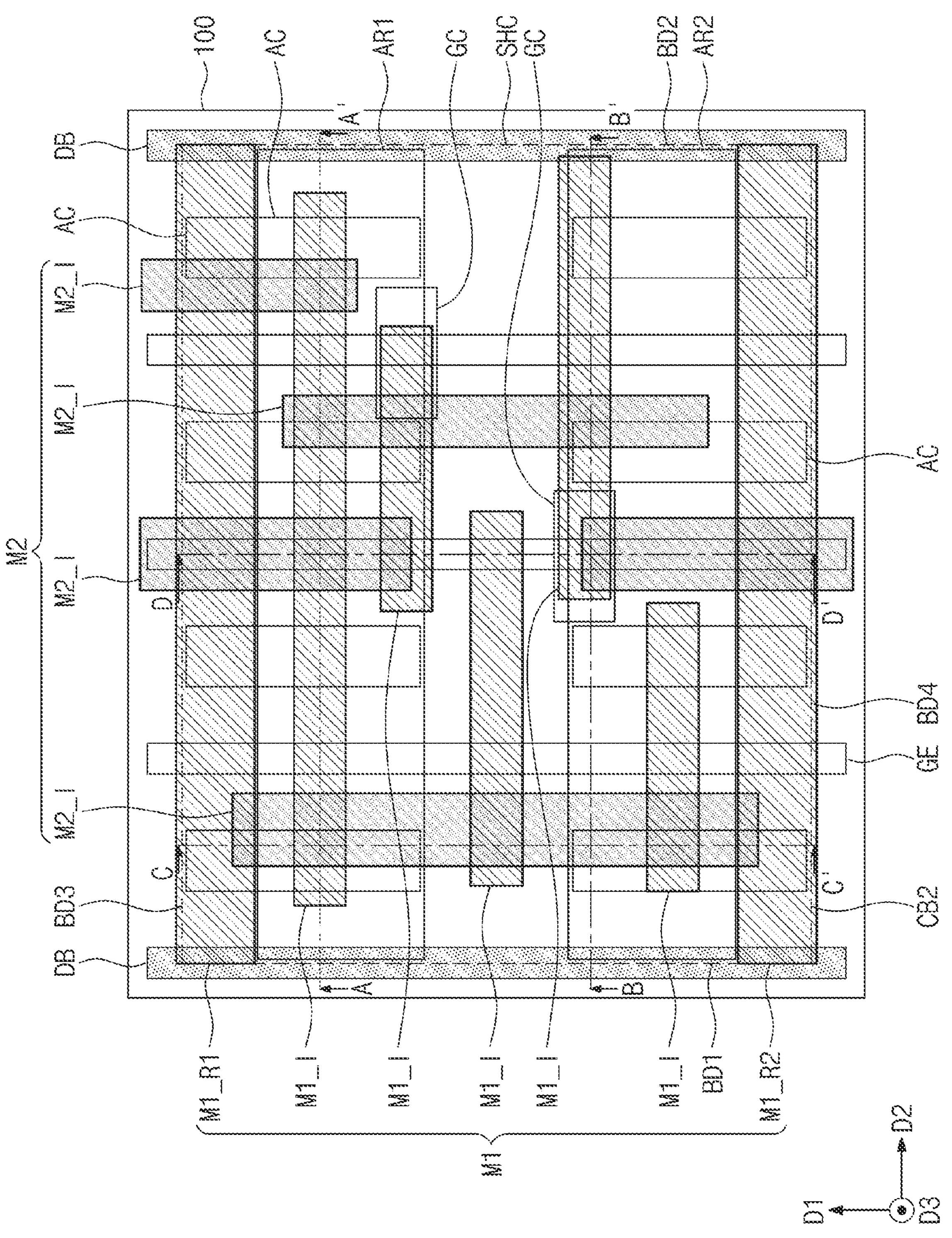
FIG. 4 is a plan (or top-down) view illustrating a semiconductor device according to embodiments of the inventive concept.
Figure 5A:
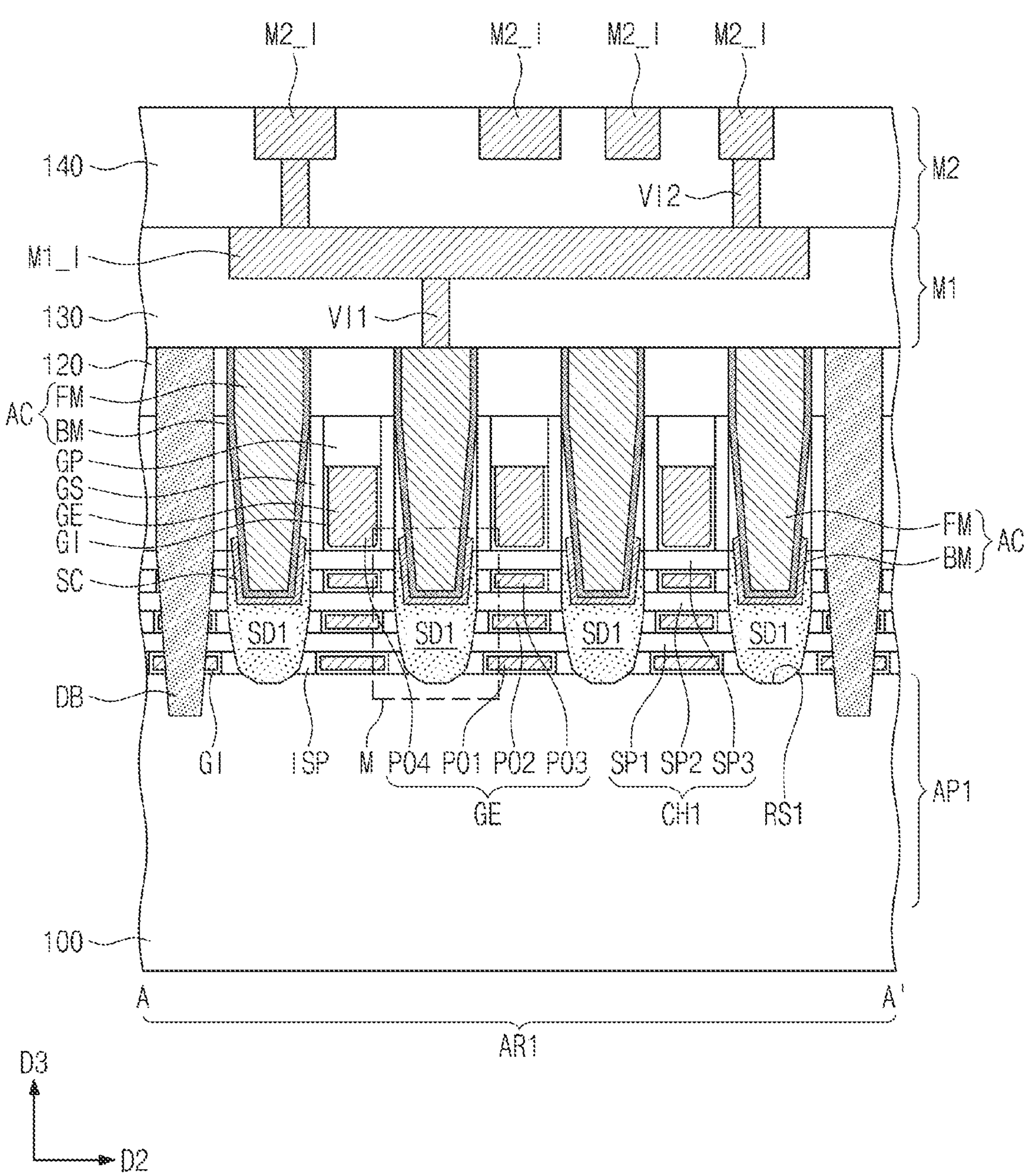
FIGS. 5A, 5B, 5C and 5D (hereafter collectively, "FIGS. 5A to 5D") are cross-sectional views respectively taken along line A-A', line B-B', line C-C', and line D-D' of FIG. 4.
Figure 5B:
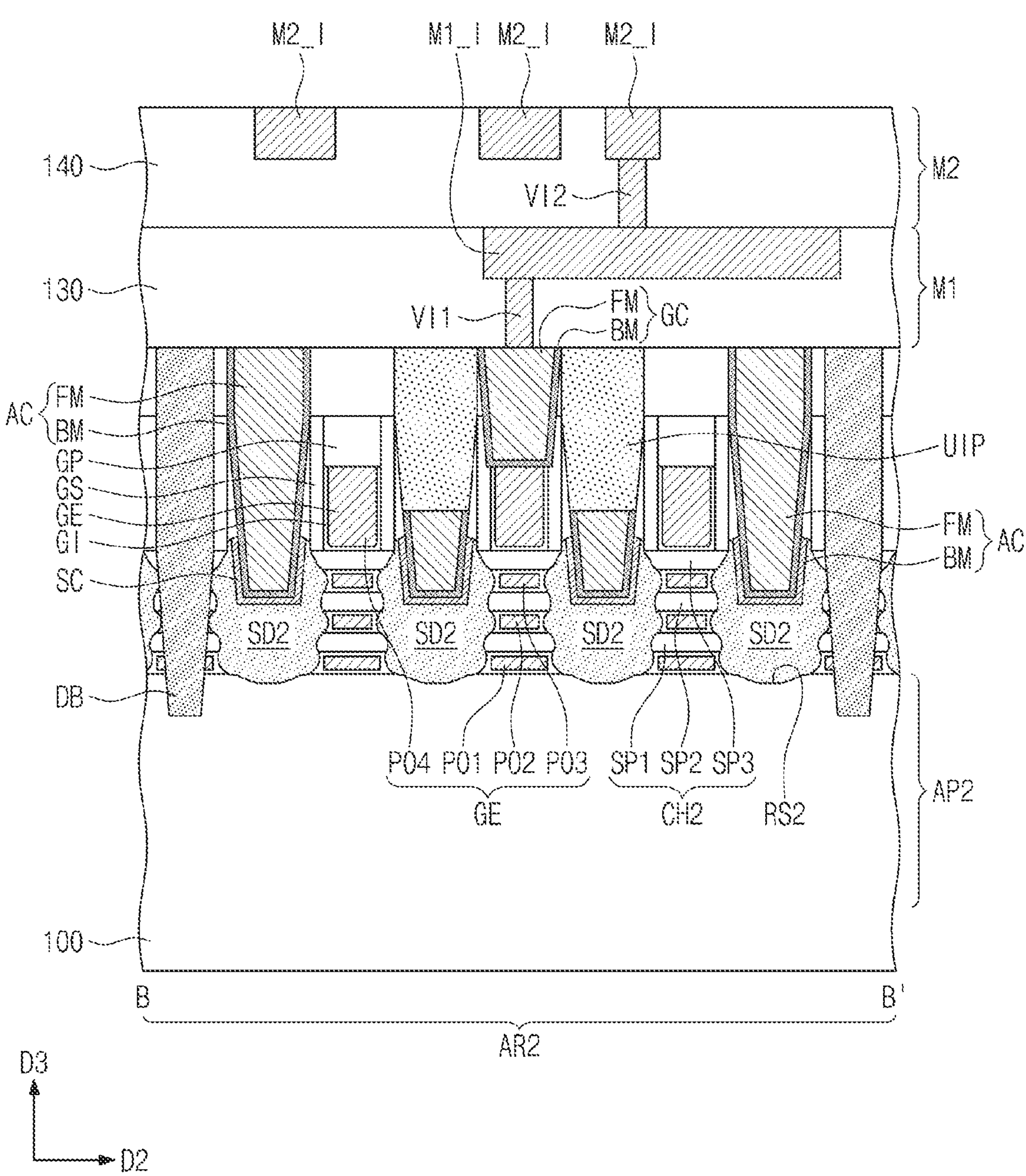
Figure 5C:
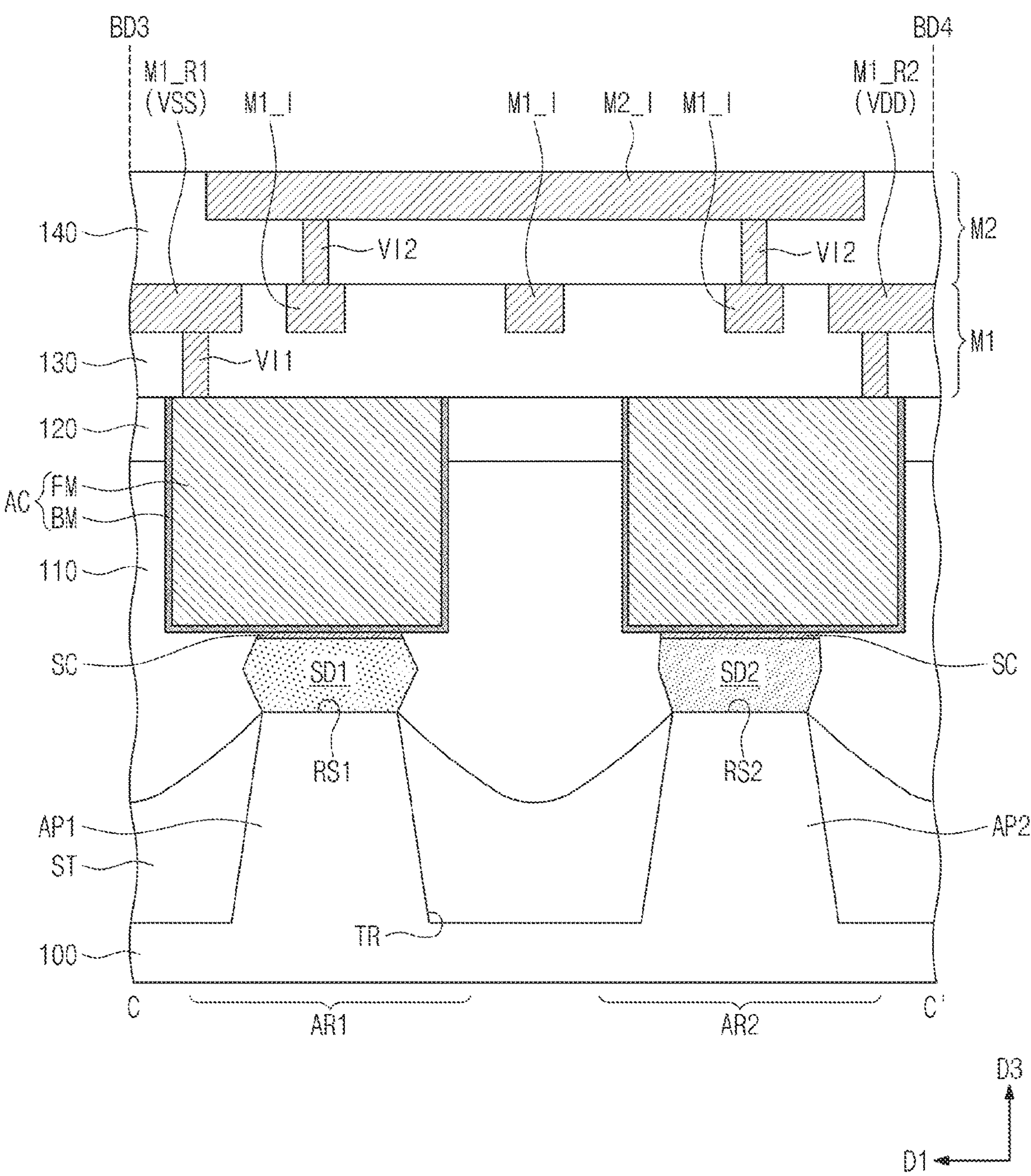

FIG. 4 is a plan (or top-down) view illustrating a semiconductor device according to embodiments of the inventive concept, and FIGS. 5A to 5D are cross-sectional views respectively taken along line A-A', line B-B', line C-C', and line D-D' of FIG. 4. FIG. 6A is an enlarged view illustrating in one embodiment the region 'M' indicated in FIG. 5A. FIG. 6B is an enlarged view illustrating in one embodiment the region 'N' indicated in FIG. 6A. The semiconductor device illustrated in FIGS. 4 and 5A to 5D is an example of the single height cell SHC of FIG. 1 in detail.

Referring to FIGS. 4 and 5A to 5D, a single height cell SHC may be provided on a substrate 100. Logic transistors constituting a logic circuit may be disposed on the single height cell SHC. The substrate 100 may be a semiconductor substrate including silicon, germanium, and silicon-germanium, or a compound semiconductor substrate. For example, the substrate 100 may be a silicon substrate.

The substrate 100 may include a first active region AR1 and a second active region AR2. Each of the first and second active regions AR1 and AR2 may extend in the second direction D2. In some embodiments, the first active region AR1 may be an NMOSFET region, and the second active region AR2 may be a PMOSFET region.

A first active pattern AP1 and a second active pattern AP2 may be defined by a trench TR formed on the substrate 100. The first active pattern AP1 may be provided on the first active region AR1, and the second active pattern AP2 may be provided on the second active region AR2. The first and second active patterns AP1 and AP2 may extend in the second direction D2. The first and second active patterns AP1 and AP2 may be a part of the substrate 100 (e.g., vertically protruding portions).

A device isolation layer ST may be provided on the substrate 100. The device isolation layer ST may fill the trench TR. The device isolation layer ST may include a silicon oxide layer. The device isolation layer ST may be disposed so as to not cover first and second channel patterns CH1 and CH2. This approach will be described hereafter in some additional detail.

The first channel pattern CH1 may be provided on the first active pattern AP1, and the second channel pattern CH2 may be provided on the second active pattern AP2. Each of the first channel pattern CH1 and the second channel pattern CH2 may include a sequentially stacked combination of a first semiconductor pattern SP1, a second semiconductor pattern SP2, and a third semiconductor pattern SP3 (hereafter collectively, "first to third semiconductor patterns SP1, SP2 and Sp3). That is, the first to third semiconductor patterns SP1, SP2, and SP3 may be spaced apart in a stack extending in a vertical direction (i.e., a third direction D3 substantially orthogonal to the first direction D1 and the second direction D2).

Each of the first to third semiconductor patterns SP1, SP2, and SP3 may include silicon (Si), germanium (Ge), or silicon-germanium (SiGe). For example, each of the first to third semiconductor patterns SP1, SP2, and SP3 may include crystalline silicon (e.g., single crystal silicon). In some embodiments, the first to third semiconductor patterns SP1, SP2, and SP3 may be stacked nanosheets.

A plurality of first source/drain patterns SD1 may be provided on the first active pattern AP1. A plurality of first recesses RS1 may be formed on the first active pattern AP1. The first source/drain patterns SD1 may be provided in the first recesses RS1, respectively. The first source/drain patterns SD1 may be impurity regions of a first conductivity type (e.g., N-type). The first channel pattern CH1 may be interposed between a pair of first source/drain patterns SD1. That is, the first to third semiconductor patterns SP1, SP2, and SP3 may connect the pair of first source/drain patterns SD1.

A plurality of second source/drain patterns SD2 may be provided on the second active pattern AP2. A plurality of second recesses RS2 may be formed on the second active pattern AP2. The second source/drain patterns SD2 may be provided in the second recesses RS2, respectively. The second source/drain patterns SD2 may be impurity regions of a second conductivity type (e.g., P-type). The second channel pattern CH2 may be interposed between a pair of second source/drain patterns SD2. That is, the first to third semiconductor patterns SP1, SP2, and SP3 may connect the pair of second source/drain patterns SD2.

The first and second source/drain patterns SD1 and SD2 may be epitaxial patterns formed by a selective epitaxial growth (SEG) process. For example, an upper surface of each of the first and second source/drain patterns SD1 and SD2 may be disposed at a higher level than an upper surface of the third semiconductor pattern SP3. As another example, the upper surface of at least one of the first and second source/drain patterns SD1 and SD2 may be disposed at substantially the same level as the upper surface of the third semiconductor pattern SP3. In this regard, the term "level" denotes a distance measured in the third direction D3 from an arbitrarily selected horizontal reference (e.g., the upper surface of the substrate 100).

In some embodiments, the first source/drain patterns SD1 may include the same semiconductor element (e.g., Si) as the substrate 100. The second source/drain patterns SD2 may include a semiconductor element (e.g., SiGe) having a lattice constant greater than a lattice constant of a semiconductor element (e.g., Si) of the substrate 100. Accordingly, the pair of second source/drain patterns SD2 may provide a compressive stress to the second channel pattern CH2 therebetween.

In some embodiments, a sidewall of the second source/drain pattern SD2 may have a rough embossed shape. That is, the sidewall of the second source/drain pattern SD2 may have a substantially wavy profile. The sidewall of the second source/drain pattern SD2 may protrude toward first, second and third portions PO1, PO2, and PO3 of a gate electrode GE—as will be described hereafter in some additional detail.

The gate electrodes GE may be provided on the first and second channel patterns CH1 and CH2. Each of the gate electrodes GE may extend in the first direction D1 and cross the first and second channel patterns CH1 and CH2. Each of the gate electrodes GE may vertically overlap the first and second channel patterns CH1 and CH2. The gate electrodes GE may be arranged in the second direction D2 according to a first pitch.

The gate electrode GE may include a first portion PO1 interposed between the active pattern AP1 or AP2 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

Figure 5D:
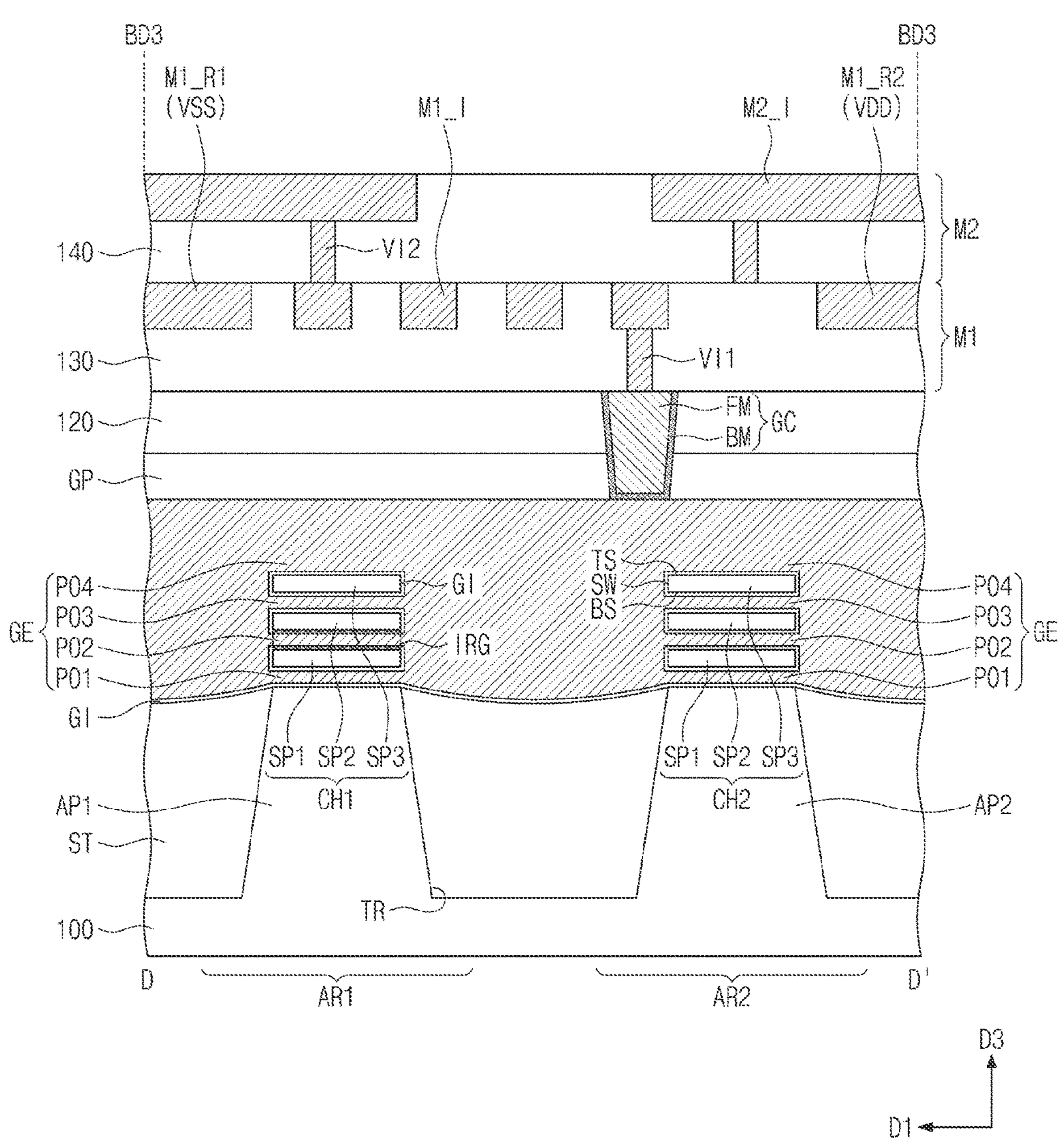
Figure 6A:
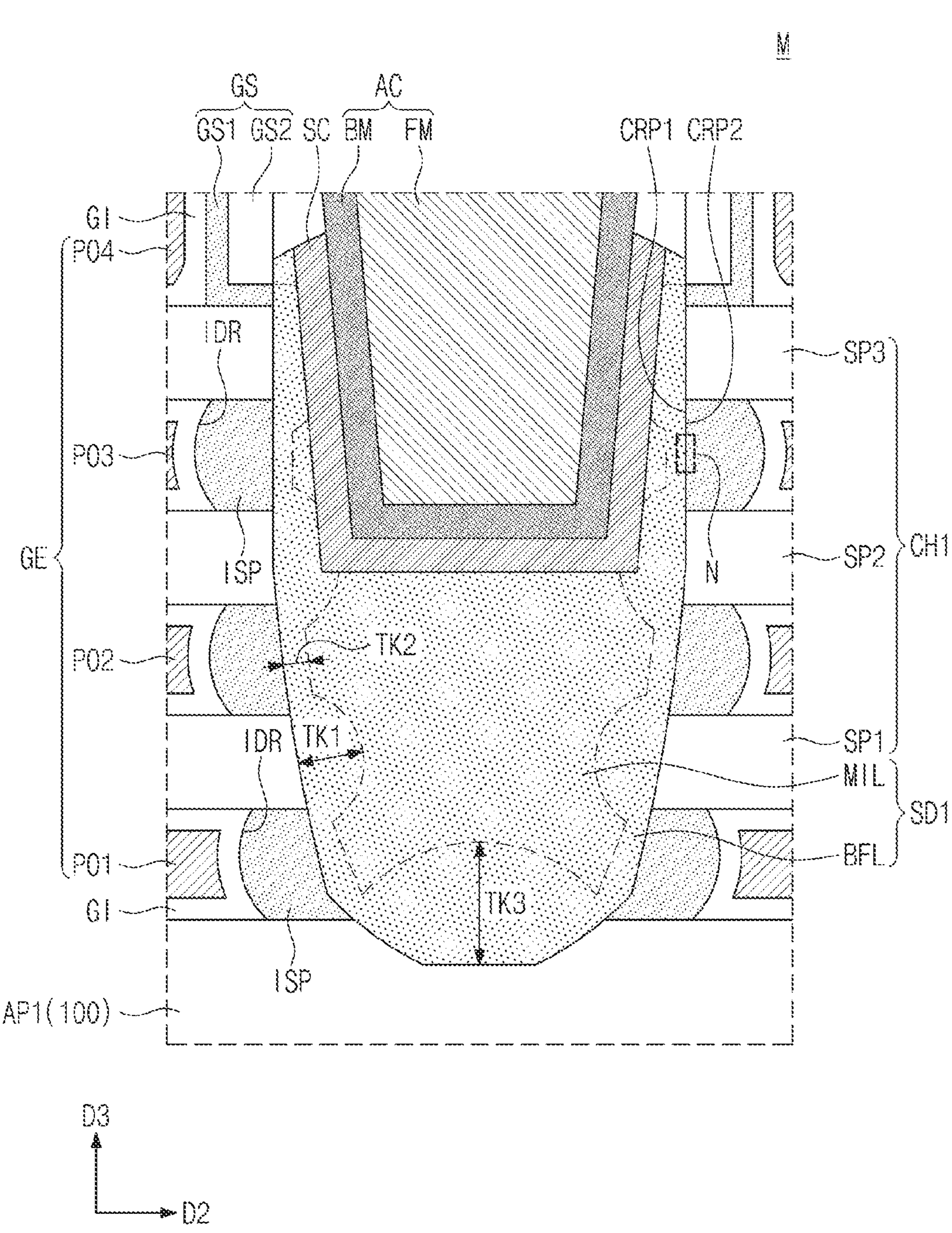
FIG. 6A is an enlarged view further illustrating in one embodiment the region 'M' indicated in FIG. 5A.
Figure 6B:
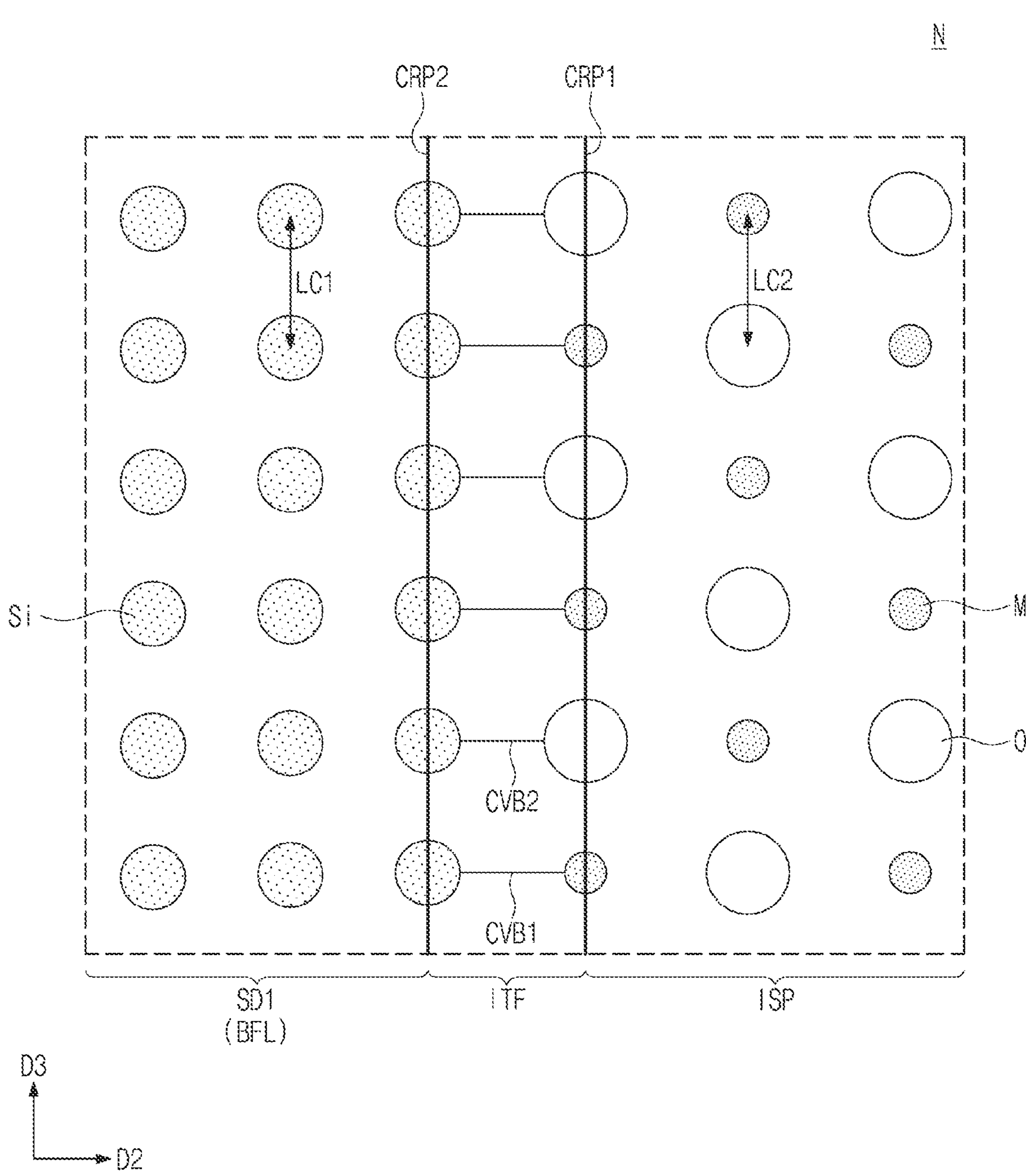
FIG. 6B is an enlarged view further illustrating in one embodiment the region 'N' indicated in FIG. 6A.

Referring to FIG. 5D, the gate electrode GE may be provided on an upper surface TS, a lower surface BS, and both sidewalls SW of each of the first to third semiconductor patterns SP1, SP2, and SP3. That is, a transistor consistent with certain embodiments of the inventive concept may be a three-dimensional FET (e.g., a multi-bridge-channel FET (MBCFET) or a gate all-around FET (GAAFET)) in which the gate electrode GE substantially surrounds the channel in a three-dimensional manner.

In the first active region AR1, inner spacers ISP may be interposed between the first to third portions PO1, PO2, and PO3 of the gate electrode GE and the first source/drain pattern SD1, respectively. Each of the first to third portions PO1, PO2, and PO3 of the gate electrode GE may be spaced apart from the first source/drain pattern SD1 with the inner spacer ISP interposed therebetween. The inner spacer ISP may prevent leakage current from the gate electrode GE. A more detailed description of the inner spacer ISP will be provided by way of example hereafter with reference to FIGS. 6A and 6B.

Referring to FIGS. 4 and 5A to 5D, a pair of gate spacers GS may be respectively disposed on both sidewalls of the fourth portion PO4 of the gate electrode GE. The gate spacers GS may extend in the first direction D1 along the gate electrode GE. Upper surfaces of the gate spacers GS may be disposed at a level higher than that of the upper surfaces of the gate electrodes GE. The upper surfaces of the gate spacers GS may be coplanar with an upper surface of a first interlayer insulating layer 110, as described hereafter in some additional detail. In some embodiments, the gate spacers GS may include at least one of SiCN, SiCON, and SiN. In other embodiments, the gate spacers GS may include a multi-layer formed of at least two of SiCN, SiCON, and SiN.

Referring to FIG. 6A, in some embodiments, the gate spacer GS may include a first spacer GS1 on the sidewall of the gate electrode GE and a second spacer GS2 on the first spacer GS1. Each of the first spacer GS1 and the second spacer GS2 may include an insulating material containing Si. For example, the first spacer GS1 may include a low-k material containing Si (e.g., SiCON). The second spacer GS2 may include a Si-containing insulating material having high etch resistance (e.g., SiN). The second spacer GS2 may function as an etch stop layer when forming active contacts AC, as described hereafter in some additional detail. The active contacts AC may be self-aligned by the second spacer GS2.

Referring to FIGS. 4 and 5A to 5D, a gate capping pattern GP may be provided on the gate electrode GE. The gate capping pattern GP may extend in the first direction D1 along the gate electrode GE. The gate capping pattern GP may include a material having etch selectivity with respect to first and second interlayer insulating layers 110 and 120 to be described later. For example, the gate capping pattern GP may include at least one of SiON, SiCN, SiCON, and SiN.

A gate insulating layer GI may be interposed between the gate electrode GE and the first channel pattern CH1 and between the gate electrode GE and the second channel pattern CH2. The gate insulating layer GI may cover the upper surface TS, the lower surface BS, and the both sidewalls SW of each of the first to third semiconductor patterns SP1, SP2, and SP3, respectively. The gate insulating layer GI may cover an upper surface of the device isolation layer ST under the gate electrode GE.

In some embodiments, the gate insulating layer GI may include a silicon oxide layer, a silicon oxynitride layer, and/or a high dielectric layer. For example, the gate insulating layer GI may have a stacked structure including a silicon oxide layer and a high dielectric layer. The high-k layer may include a high-k material having a dielectric constant higher than that of the silicon oxide layer. For example, the high-k material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In some embodiments, the semiconductor device may include a negative capacitance (NC) FET using a negative capacitor. For example, the gate insulating layer GI may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series and a capacitance of each capacitor has a positive value, a total capacitance is lower than a capacitance of each individual capacitor. Alternately, when at least one of the capacitances of two or more capacitors connected in series has a negative value, the total capacitance may have a positive value and be greater than an absolute value of each individual capacitance.

When the ferroelectric material layer having a negative capacitance and the paraelectric material layer having a positive capacitance are connected in series, a total capacitance of the serially connected ferroelectric material layer and the paraelectric material layer may increase. By using the increase in the overall capacitance value, the transistor including the ferroelectric material layer may have a subthreshold swing (SS) of less than 60 mV/decade at room temperature.

The ferroelectric material layer may exhibit ferroelectric properties. Here, the ferroelectric material layer may include at least one of, for example, hafnium oxide, hafnium zirconium oxide, barium strontium titanium oxide, barium titanium oxide, and lead zirconium oxide. In one particular example, hafnium zirconium oxide may be a material in which zirconium (Zr) is doped into hafnium oxide. Alternately, hafnium zirconium oxide may be a compound including hafnium (Hf), zirconium (Zr) and oxygen (O).

The ferroelectric material layer may further include at least one dopant, such as aluminum (Al), titanium (Ti), niobium (Nb), lanthanum (La), yttrium (Y), magnesium (Mg), silicon (Si), calcium (Ca), cerium (Ce)), dysprosium (Dy), erbium (Er), gadolinium (Gd), germanium (Ge), scandium (Sc), strontium (Sr), and tin (Sn). Here, the type of dopant(s) included in the ferroelectric material layer may vary with choice of ferroelectric material included in the ferroelectric material layer.

For example, when the ferroelectric material layer includes hafnium oxide, the dopant included in the ferroelectric material layer may be at least one of Gd, Si, Zr, Al, and Y. Assuming the use of Al as a dopant, the ferroelectric material layer may include 3 to 8 at % (atomic %) of Al. Thus, a dopant ratio may be a ratio of Al to a sum of hafnium and Al. Assuming the use of Si as a dopant, the ferroelectric material layer may include silicon of 2 to at %. Assuming the use of Y as a dopant the ferroelectric material layer may include yttrium of 2 to 10 at %. Assuming the use of Gd as a dopant, the ferroelectric material layer may include GD of 1 to 7 at %, and assuming the use of Zr as a dopant, the ferroelectric material layer may include zirconium of 50 to 80 at %.

The paraelectric material layer may exhibit paraelectric properties. The paraelectric material layer may include, for example, at least one of silicon oxide and a metal oxide having a high dielectric constant. The metal oxide included in the paraelectric material layer may include, for example, at least one of hafnium oxide, zirconium oxide, and aluminum oxide, but is not limited thereto.

The ferroelectric material layer and the paraelectric material layer may include the same material. The ferroelectric material layer may have ferroelectric properties, but the paraelectric material layer may not have ferroelectric properties. For example, when the ferroelectric material layer and the paraelectric material layer include hafnium oxide, a crystal structure of hafnium oxide included in the ferroelectric material layer is different from a crystal structure of hafnium oxide included in the paraelectric material layer.

The ferroelectric material layer may have a thickness sufficient to exhibit ferroelectric properties. For example, the thickness of the ferroelectric material layer may range from about 0.5 to 10 nm, but is not limited thereto. As a critical thickness sufficient to exhibit ferroelectric properties may vary with each ferroelectric material, the thickness of the ferroelectric material layer will vary with choice of ferroelectric material.

For example, the gate insulating layer GI may include one ferroelectric material layer. Alternately, the gate insulating layer GI may include a plurality of spaced apart ferroelectric material layers. The gate insulating layer GI may have a stacked structure in which a plurality of ferroelectric material layers and a plurality of paraelectric material layers are alternately stacked.

Referring to FIGS. 4 and 5A to 5D, the gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work function metal that adjusts a threshold voltage of the transistor. A desired threshold voltage of the transistor may be achieved by adjusting a thickness and a composition of the first metal pattern. For example, the first to third portions PO1, PO2, and PO3 of the gate electrode GE may be formed of the first metal pattern that is a work function metal.

The first metal pattern may include a metal nitride layer. The first metal pattern may include at least one metal, such as for example, titanium (Ti), tantalum (Ta), aluminum (Al), tungsten (W), molybdenum (Mo), nitrogen (N) and carbon (C). The first metal pattern may include a plurality of stacked work function metal layers.

The second metal pattern may include a metal having a lower resistance than that of the first metal pattern. The second metal pattern may include at least one metal, such as for example, tungsten (W), aluminum (Al), titanium (Ti), and tantalum (Ta). The fourth portion PO4 of the gate electrode GE may include the first metal pattern and the second metal pattern on the first metal pattern, for example.

The first interlayer insulating layer 110 may be provided on the substrate 100. The first interlayer insulating layer 110 may cover the gate spacers GS and the first and second source/drain patterns SD1 and SD2. An upper surface of the first interlayer insulating layer 110 may be substantially coplanar with an upper surface of the gate capping pattern GP and an upper surface of the gate spacer GS. The second interlayer insulating layer 120 covering the gate capping pattern GP may be disposed on the first interlayer insulating layer 110. A third interlayer insulating layer 130 may be provided on the second interlayer insulating layer 120. A fourth interlayer insulating layer 140 may be provided on the third interlayer insulating layer 130. The first to fourth interlayer insulating layers 110 to 140 may include a silicon oxide layer, for example.

The single height cell SHC may have a first boundary BD1 and an opposing (or e.g., facing in the second direction D2) second boundary BD2. The first and second boundaries BD1 and BD2 may extend in the first direction D1. The single height cell SHC may have a third boundary BD3 and an opposing (e.g., in the first direction D1) fourth boundary BD4. The third and fourth boundaries BD3 and BD4 may extend in the second direction D2.

A pair of separation structures DB facing each other in the second direction D2 may be provided on both sides of the single height cell SHC. For example, the pair of separation structures DB may be provided on the first and second boundaries BD1 and BD2 of the single height cell SHC, respectively. The separation structure DB may extend parallel to the gate electrodes GE in the first direction D1. A pitch between the separation structure DB and the gate electrode GE adjacent thereto may be the same as the first pitch.

The separation structure DB may penetrate the first and second interlayer insulating layers 110 and 120 to extend into the first and second active patterns AP1 and AP2. The separation structure DB may pass through each of the first and second active patterns AP1 and AP2. The separation structure DB may electrically separate an active region of the single height cell SHC from an active region of another adjacent cell.

The active contacts AC may be provided through the first and second interlayer insulating layers 110 and 120 and electrically connected to the first and second source/drain patterns SD1 and SD2, respectively. A pair of active contacts AC may be respectively provided on both sides of the gate electrode GE. In some embodiments, the active contact AC may have a bar shape extending in the first direction D1.

The active contact AC may be a self-aligned contact. That is, the active contact AC may be formed in a self-aligned manner using the gate capping pattern GP and the gate spacer GS. For example, the active contact AC may cover at least a portion of a sidewall of the gate spacer GS. In some embodiments, the active contact AC may partially cover the upper surface of the gate capping pattern GP.

A metal-semiconductor compound layer SC, for example, a silicide layer may be interposed between the active contact AC and the first source/drain pattern SD1 and between the active contact AC and the second source/drain pattern SD2, respectively. The active contact AC may be electrically connected to the source/drain patterns SD1 and SD2 through the metal-semiconductor compound layer SC. For example, the metal-semiconductor compound layer SC may include at least one of, for example, titanium-silicide, tantalum-silicide, tungsten-silicide, nickel-silicide, and cobalt-silicide.

Gate contacts GC may be provided through the second interlayer insulating layer 120 and the gate capping pattern GP to be electrically connected to the gate electrodes GE, respectively. The gate contacts GC may be disposed to overlap the first active region AR1 and the second active region AR2, respectively. As an example, the gate contact GC may be provided on the second active pattern AP2. (See, e.g., FIG. 5B).

Referring to FIG. 5B, in some embodiments, an upper portion of the active contact AC adjacent to the gate contact GC may be filled with an upper insulating pattern UIP. A lower surface of the upper insulating pattern UIP may be disposed at a level lower than that of a lower surface of the gate contact GC. That is, the upper surface of the active contact AC adjacent to the gate contact GC may lower than the lower surface of the gate contact GC by the upper insulating pattern UIP. Accordingly, it is possible to prevent potential shorting problems associated with the gate contact GC contacting the adjacent active contact AC.

Each of the active contact AC and the gate contact GC may include a conductive pattern FM and a barrier pattern BM surrounding the conductive pattern FM. For example, the conductive pattern FM may include at least one of, for example, aluminum, copper, tungsten, molybdenum, and cobalt. The barrier pattern BM may cover sidewalls and a lower surface of the conductive pattern FM. The barrier pattern BM may include a metal layer/metal nitride layer. The metal layer may include at least one of, for example, titanium, tantalum, tungsten, nickel, cobalt, and platinum. The metal nitride layer may include at least one of, for example, a titanium nitride layer (TiN), a tantalum nitride layer (TaN), a tungsten nitride layer (WN), a nickel nitride layer (NiN), a cobalt nitride layer (CoN), and a platinum nitride layer (PtN).

A first metal layer M1 may be provided in the third interlayer insulating layer 130. For example, the first metal layer M1 may include a first power wiring M1_R1, a second power wiring M1_R2, and first wirings M1_I. Each of the wirings M1_R1, M1_R2, and M1_I of the first metal layer M1 may extend parallel in the second direction D2.

Here, the first and second power wirings M1_R1 and M1_R2 may be respectively provided on the third and fourth boundaries BD3 and BD4 of the single height cell SHC. The first power wiring M1_R1 may extend in the second direction D2 along the third boundary BD3. The second power wiring M1_R2 may extend in the second direction D2 along the fourth boundary BD4.

The first wirings M1_I of the first metal layer M1 may be disposed between the first and second power wirings M1_R1 and M1_R2. The first wirings M1_I of the first metal layer M1 may be arranged in the first direction D1 at a second pitch. The second pitch may be smaller than the first pitch. A line width of each of the first wirings M1_I may be less than a line width of each of the first and second power wirings M1_R1 and M1_R2.

The first metal layer M1 may further include first vias VI1. The first vias VI1 may be provided under the wirings M1_R1, M1_R2, and M1_I of the first metal layer M1, respectively. The active contact AC and the wiring of the first metal layer M1 may be electrically connected through the first via VI1. The gate contact GC and the wiring of the first metal layer M1 may be electrically connected through the first via VI1.

The wiring of the first metal layer M1 and the first via VI1 below the wiring may be formed through separate processes. That is, each of the wiring and the first via VI1 of the first metal layer M1 may be respectively formed using a single damascene process. In some embodiments, a semiconductor device according to embodiments of the inventive concept may be formed using a process of less than 20 nm.

A second metal layer M2 may be provided in the fourth interlayer insulating layer 140. The second metal layer M2 may include a plurality of second wirings M2_I. Each of the second wirings M2_I of the second metal layer M2 may have a line shape or a bar shape extending in the first direction D1. That is, the second wirings M2_I may extend parallel in the first direction D1.

The second metal layer M2 may further include second vias VI2 respectively provided under the second wirings M2_I. The wiring of the first metal layer M1 and the wiring of the second metal layer M2 may be electrically connected through the second via VI2. For example, the wiring of the second metal layer M2 and the second via VI2 below the wiring may be formed together using a dual damascene process.

The wiring of the first metal layer M1 and the wiring of the second metal layer M2 may include the same or different conductive materials. For example, the wiring of the first metal layer M1 and the wiring of the second metal layer M2 may include at least one metal material, such as for example, aluminum, copper, tungsten, molybdenum, ruthenium, and cobalt. Additionally disposed metal layers (e.g., M3, M4, M5 . . . ) may be stacked on the fourth interlayer insulating layer 140. Each of the stacked metal layers may include wirings for routing between cells.

The inner spacers ISP and the first source/drain pattern SD1 will now be described in some additional detail with reference to FIG. 6A. An indent region IDR may be defined between each of the first to third portions PO1 to PO3 of the gate electrode GE and the first source/drain pattern SD1. The indent region IDR may be an empty space extending from the first source/drain pattern SD1 toward a corresponding one of the first to third portions PO1 to PO3. A sidewall of each of the first to third portions PO1 to PO3 may be concave due to the indent region IDR.

The inner spacer ISP may be provided in each of the indent regions IDR. In some embodiments, the inner spacer ISP may completely fill the indent region IDR. A first side of the inner spacer ISP may directly contact the gate insulating layer GI. A second side of the inner spacer ISP facing the first side in the second direction D2 may directly contact the first source/drain pattern SD1. In some embodiments, the second side of the inner spacer ISP may include a first crystal plane CRP1, as will be described hereafter in some additional detail.

In some embodiments, the inner spacer ISP may include crystalline metal oxide. The crystalline metal oxide may be denoted by the formula (MO), wherein (O) is an oxygen atom and (M) is a metal atom, such as magnesium (Mg), beryllium (Be), and gallium (Ga), and assuming an atomic ratio of (M) to (O) of 1:1. Thus, the crystalline metal oxide may include MgO, BeO, or GaO.

The inner spacer ISP may be formed of crystalline metal oxide, and thus the inner spacer ISP may be crystalline rather than amorphous. A lattice structure of the inner spacer ISP may be similar to or substantially the same as a lattice structure of the semiconductor patterns SP1 to SP3 and/or the first source/drain pattern SD1. For example, single crystal silicon such as the semiconductor patterns SP1 to SP3 and/or the first source/drain patterns SD1 may have a face-centered cubic structure (FCC). The crystalline metal oxide of the inner spacer ISP may also have a face-centered cubic structure (FCC).

A lattice constant (or twice the lattice constant) of the inner spacer ISP according to embodiments of the inventive concept may range from about 4.2 Å to about 6.2 Å. In one particular example, the lattice constant of single crystal silicon may be about 5.3 Å. The inner spacer ISP according to embodiments of the inventive concept may include crystalline metal oxide similar to a lattice constant of silicon, thereby achieving lattice matching between the inner spacer ISP and the first source/drain pattern SD1 and preventing a lattice defect from occurring in the first source/drain pattern SD1.

The inner spacer ISP may have a relatively low dielectric constant close to that of silicon nitride. For example, the dielectric constant of the inner spacer ISP may range from about 6 to 10. The inner spacer ISP may have a low dielectric constant, thereby reducing parasitic capacitance between the gate electrode GE and the first source/drain pattern SD1.

The inner spacer ISP may have a relatively high band gap to substantially function as an insulator. The inner spacer ISP may insulate between the gate electrode GE and the first source/drain pattern SD1. The inner spacer ISP may include a crystalline dielectric having a band gap ranging from about 4 eV to about 20 eV.

The inner spacer ISP may include a material different from that of the first and second spacers GS1 and GS2 of the gate spacer GS. As described above, the first and second spacers GS1 and GS2 may include an insulating material containing Si (e.g., SiCON, SiN, SiON). Alternately, the inner spacer ISP may include crystalline metal oxide in which Si is omitted.

The first source/drain pattern SD1 may include a buffer layer BFL and a main layer MIL on the buffer layer BFL. The buffer layer BFL may directly cover the inner surface of the first recess RS1. The buffer layer BFL may cover sidewalls of the first to third semiconductor patterns SP1 to SP3 as well as sidewalls of the inner spacers ISP.

The buffer layer BFL on the semiconductor patterns SP1 to SP3 may have a first thickness TK1. The buffer layer BFL on the inner spacer ISP may have a second thickness TK2. The buffer layer BFL on a bottom of the first recess RS1 may have a third thickness TK3. The first thickness TK1 may be greater than the second thickness TK2. The third thickness TK3 may be greater than the first thickness TK1.

The buffer layer BFL may contain arsenic (As) as an N-type impurity. The main layer MIL may be provided on the buffer layer BFL to completely fill the first recess RS1. The main layer MIL may contain phosphorus (P) as an N-type impurity. A concentration of phosphorus (P) in the main layer MIL may be greater than a concentration of arsenic (As) in the buffer layer BFL.

Both the buffer layer BFL and the main layer MIL may include single crystal silicon. The buffer layer BFL and the main layer MIL may include the same semiconductor material, and thus the buffer layer BFL and the main layer MIL may not be physically distinguished from each other. That is, a boundary between the buffer layer BFL and the main layer MIL, as shown in FIG. 6A, may be understood as a virtual boundary, and the boundary between the real buffer layer BFL and the main layer MIL may not be confirmed by electron microscopic analysis.

Referring to FIGS. 6A and 6B, the inner spacer ISP may include the first crystal plane CRP1 in contact with the first source/drain pattern SD1. The first source/drain pattern SD1 may include a second crystal plane CRP2 in contact with the inner spacer ISP. The first crystal plane CRP1 and the second crystal plane CRP2 may be crystal planes having the same Miller index.

As shown in FIG. 6B, silicon atoms (Si) may be disposed in a specific lattice structure (e.g., FCC) in the first source/drain pattern SD1. Metal atoms (M) and oxygen atoms (O) may be arranged in a specific lattice structure (e.g., FCC) in the inner spacer ISP.

In this regard, a distance between the silicon atoms (Si) may be a first lattice constant LC1. A distance between the metal atom (M) and the oxygen atom (O) may be a second lattice constant LC2. Further in this regard, the first lattice constant LC1 may be about 5.3 Å, and the second lattice constant LC2 may range from about 4.2 Å to about 6.2 Å.

The metal atoms (M) and the oxygen atoms (O) may be two-dimensionally arranged on the first crystal plane CRP1. The silicon atoms (Si) may be two-dimensionally arranged on the second crystal plane CRP2. The metal atoms (M) and the oxygen atoms (O) of the first crystal plane CRP1 may be bonded to the silicon atoms (Si) of the second crystal plane CRP2, respectively. Accordingly, a first covalent bond CVB1 may be formed between the metal atom (M) of the first crystal plane CRP1 and the silicon atom (Si) of the second crystal plane CRP2, and a second covalent bond CVB2 may be formed between the oxygen atom (O) of the first crystal plane CRP1 and the silicon atom (Si) of the second crystal plane CRP2.

The first and second covalent bonds CVB1 may be at an interface ITF between the first crystal plane CRP1 of the inner spacer ISP and the second crystal plane CRP2 of the first source/drain pattern SD1. As described hereafter in some additional detail, the buffer layer BFL of the first source/drain pattern SD1 may be epitaxially grown on the first crystal plane CRP1 of the inner spacer ISP. As a result, the buffer layer BFL may be grown along the crystal structure of the inner spacer ISP while the silicon atoms (Si) of the first source/drain pattern SD1 covalently bond with the metal and oxygen atoms (M) and (O) of the inner spacer ISP.

In some embodiments, the metal and oxygen atoms (M) and (O) of the first crystal plane CRP1 and the silicon atoms (Si) of the second crystal plane CRP2 may be combined in a 1:1 ratio. This is because the second lattice constant LC2 between the metal and oxygen atoms (M) and (O) is substantially the same as or very similar to the first lattice constant LC1 between the silicon atoms (Si). The second lattice constant LC2 may be 0.8 to 1.2 times the first lattice constant LC1, and more particularly, 0.9 to 1.1 times the first lattice constant LC1.

In some embodiments, BeO in the crystalline metal oxide has the second lattice constant LC2 of about 2.7 Å, which is about half the value of the first lattice constant LC1. In this case, beryllium and oxygen atoms (Be and O) of the first crystal plane CRP1 and the silicon atoms (Si) of the second crystal plane CRP2 may be combined in a 2:1 ratio. Accordingly, even when the inner spacer ISP is formed of crystalline BeO, the buffer layer BFL may be grown without lattice mismatch on the inner spacer ISP.

The inner spacers ISP described in relation to FIGS. 6A and 6B may also be provided on the second active region AR2. That is, the above-described inner spacers ISP may also be provided between the first to third portions PO1, PO2, and PO3 of the gate electrode GE and the second source/drain pattern SD2, respectively. And the inner spacers ISP and the source/drain patterns epitaxially grown therefrom according to certain embodiments of the inventive concept may be applied to PMOSFETs as well as NMOSFETs without limitation.

FIGS. 7A to 12C are cross-sectional views illustrating a method of manufacturing a semiconductor device according to embodiments of the inventive concept. Here, FIGS. 7A, 8A, 9A, 10A, 11A, and 12A are cross-sectional views corresponding to line A-A' of FIG. 4; FIGS. 9B and 10B are cross-sectional views corresponding to line B-B' of FIG. 4; FIGS. 9C, 11B, and 12B are cross-sectional views corresponding to line C-C' of FIG. 4; and FIGS. 7B, 8B, 11C and 12C are cross-sectional views corresponding to line D-D' of FIG. 4.

Figure 7A:
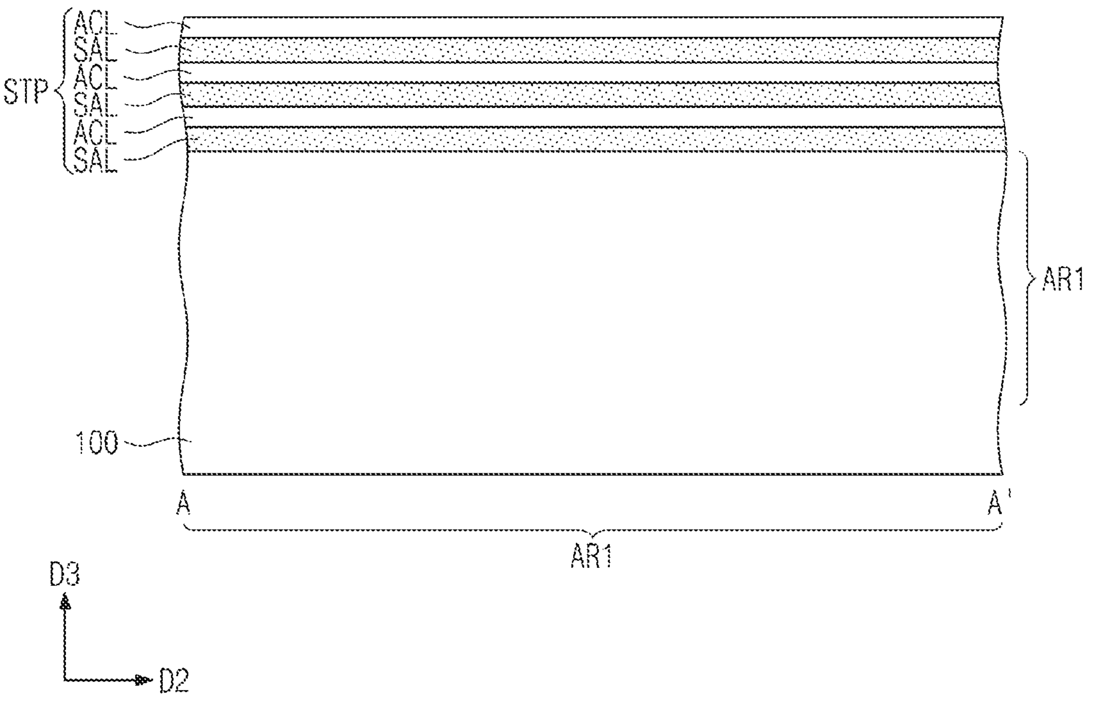
FIGS. 7A, 7B, 8A, 8B, 9A, 9B, 9C, 10A, 10B, 10C, 11A, 11B, 11C, 12A, 12B and 12C (hereafter collectively, "FIGS. 7A to 12C") are related cross-sectional views illustrating methods of manufacturing semiconductor devices according to embodiments of the inventive concept. More particularly.
Figure 7B:
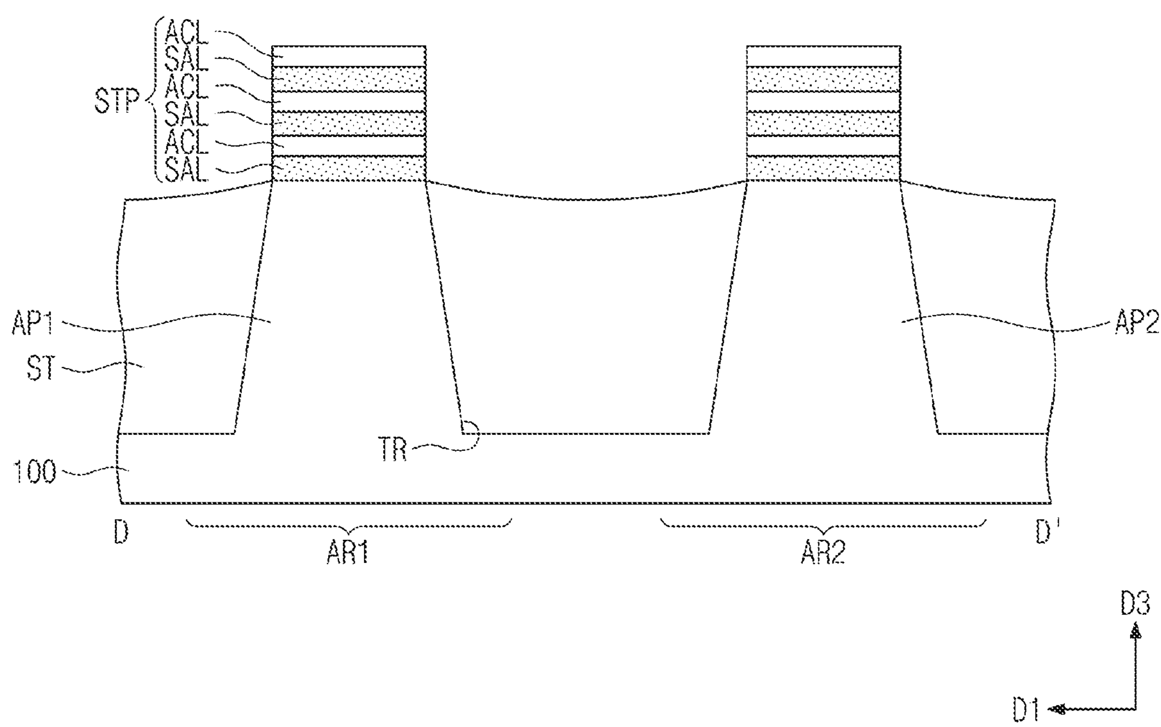

Referring to FIGS. 7A and 7B, a substrate 100 is provided including first and second active regions AR1 and AR2. Active layers ACL and sacrificial layers SAL may be alternately stacked on the substrate 100. The active layers ACL may include one of silicon (Si), germanium (Ge), and silicon-germanium (SiGe), and the sacrificial layers SAL may include another one of silicon (Si), germanium (Ge) and silicon-germanium (SiGe).

The sacrificial layer SAL may include a material having an etch selectivity with respect to the active layer ACL. For example, the active layers ACL may include silicon (Si), and the sacrificial layers SAL may include silicon-germanium (SiGe). Concentration of germanium (Ge) in each of the sacrificial layers SAL may range from about 10 at % to about at %.

Mask patterns may be formed on the first and second active regions AR1 and AR2 of the substrate 100, respectively. The mask pattern may have a line shape or a bar shape extending in a second direction D2.

A patterning process may be performed using the mask patterns as an etch mask to form a trench TR defining a first active pattern AP1 and a second active pattern AP2. The first active pattern AP1 may be formed on the first active region AR1. The second active pattern AP2 may be formed on the second active region AR2.

A stacked pattern STP may be formed on each of the first and second active patterns AP1 and AP2. A stacked pattern STP may include an alternately stacked combination of the active layers ACL and the sacrificial layers SAL. The stacked pattern STP may be formed together with the first and second active patterns AP1 and AP2 during the patterning process.

A device isolation layer ST filling the trench TR may be formed. That is, an insulating layer covering the first and second active patterns AP1 and AP2 and the stacked patterns STP may be formed on the entire surface of the substrate 100. The insulating layer may be recessed until the stacked patterns STP are exposed to form the device isolation layer ST.

The device isolation layer ST may include an insulating material such as a silicon oxide layer. The stacked patterns STP may be exposed on the device isolation layer ST. That is, the stacked patterns STP may protrude vertically from the device isolation layer ST.

Figure 8A:
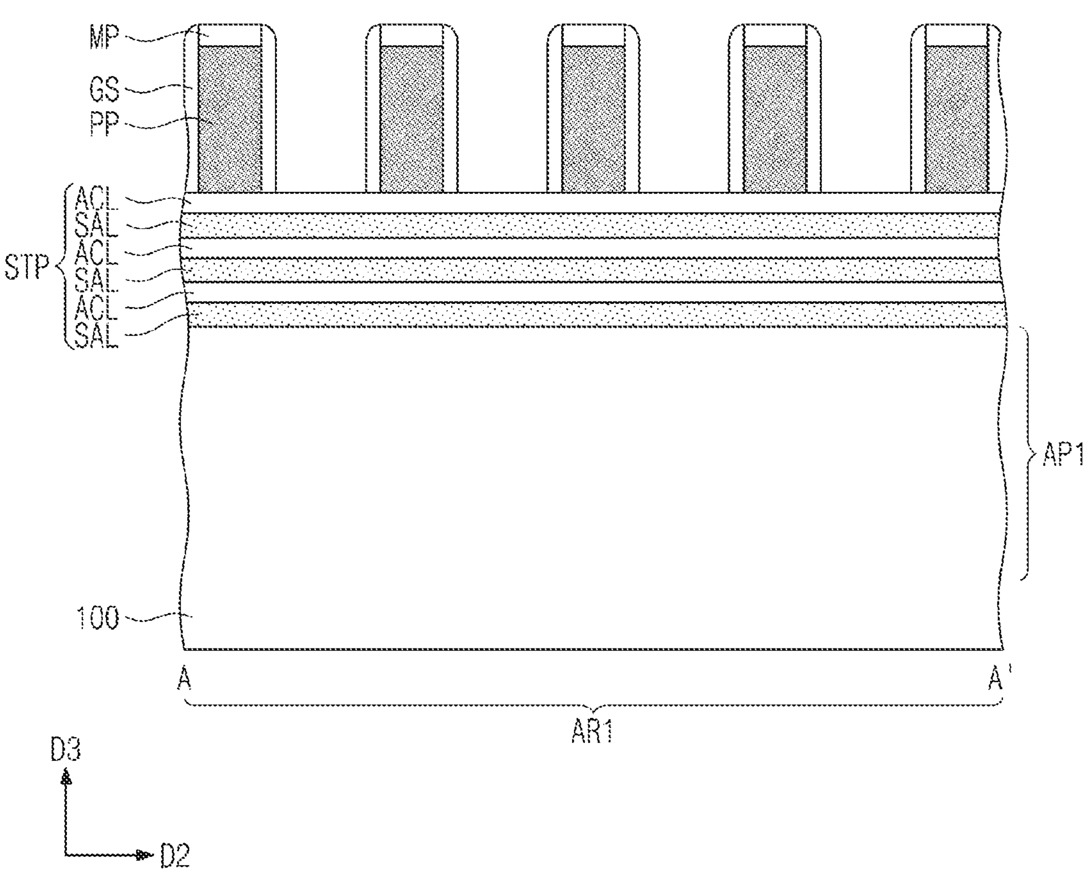
Figure 8B:
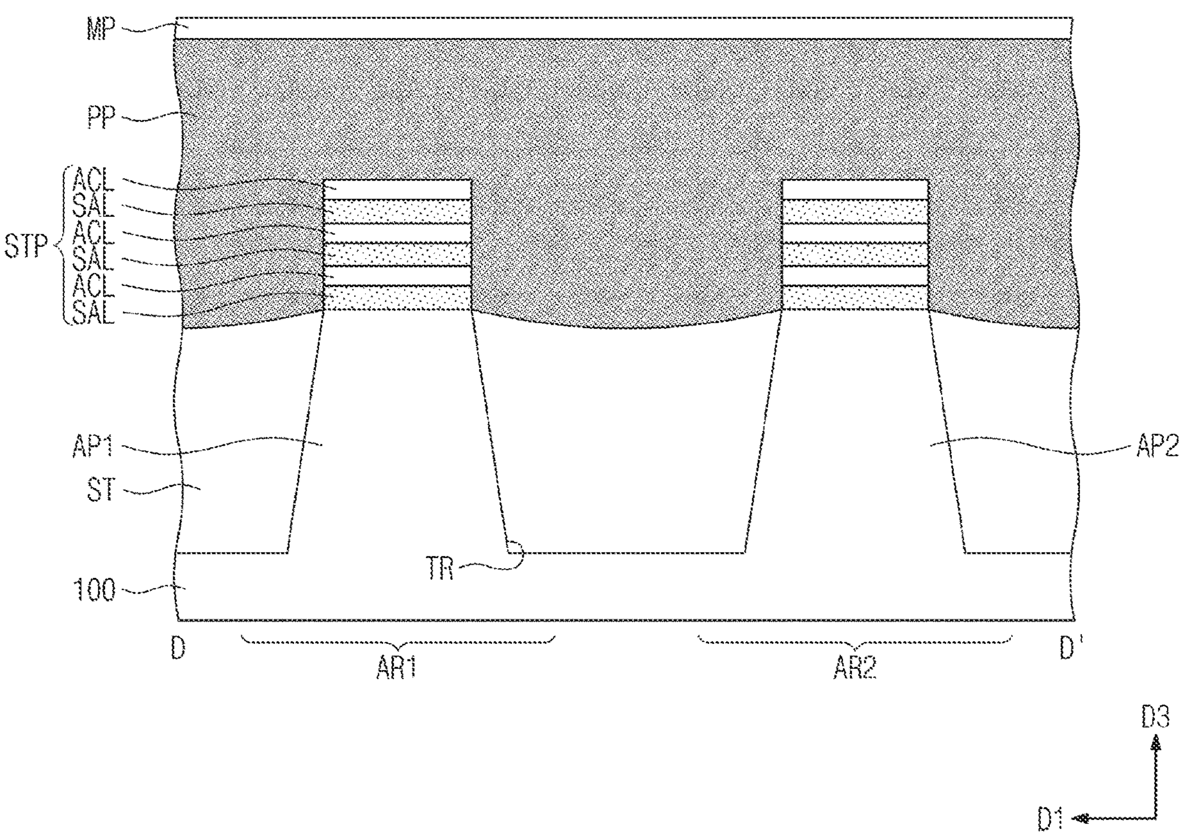

Referring to FIGS. 8A and 8B, sacrificial patterns PP crossing the stacked patterns STP may be formed on the substrate 100. Each of the sacrificial patterns PP may be formed in a line shape or a bar shape extending in a first direction DE The sacrificial patterns PP may be arranged in the second direction D2 at a first pitch.

For example, embodiments of the inventive concept may include forming the sacrificial patterns PP by forming a sacrificial layer on the entire surface of the substrate 100, forming hard mask patterns MP on the sacrificial layer, and patterning the sacrificial layer using the hard mask patterns MP as an etch mask. Here, the sacrificial layer may include polysilicon.

A pair of gate spacers GS may be formed on both sidewalls of each of the sacrificial patterns PP. Forming the gate spacers GS may include conformally forming a gate spacer layer on the entire surface of the substrate 100 and anisotropically etching the gate spacer layer. In some embodiments, the gate spacer GS may be a multilayer including at least two layers.

Figure 9A:
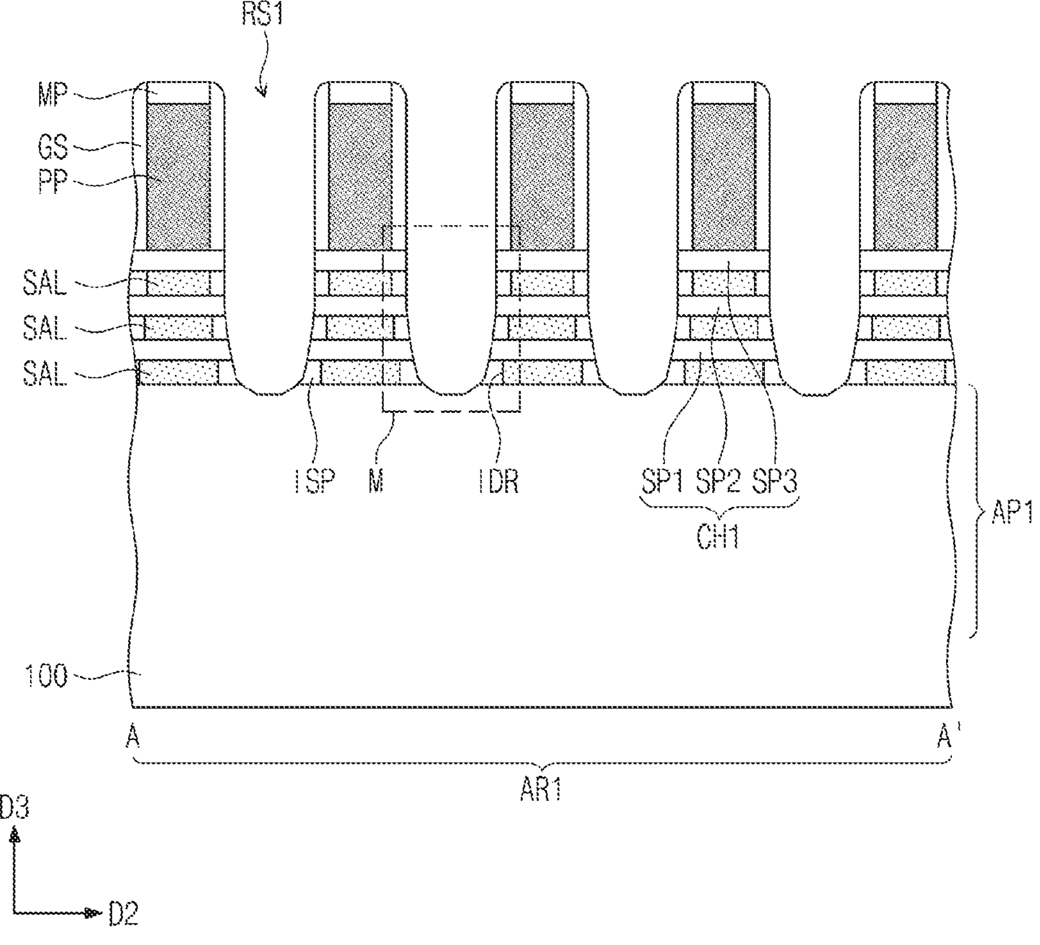
Figure 9B:
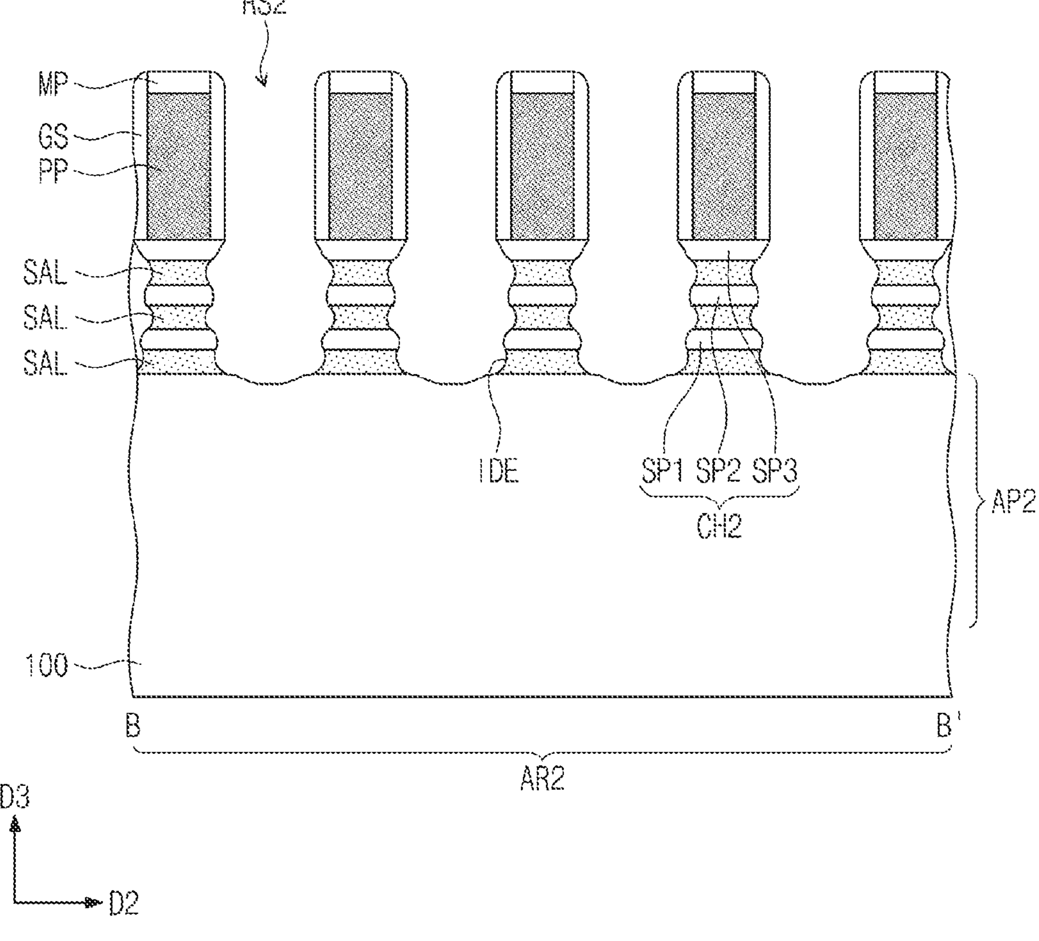
Figure 9C:
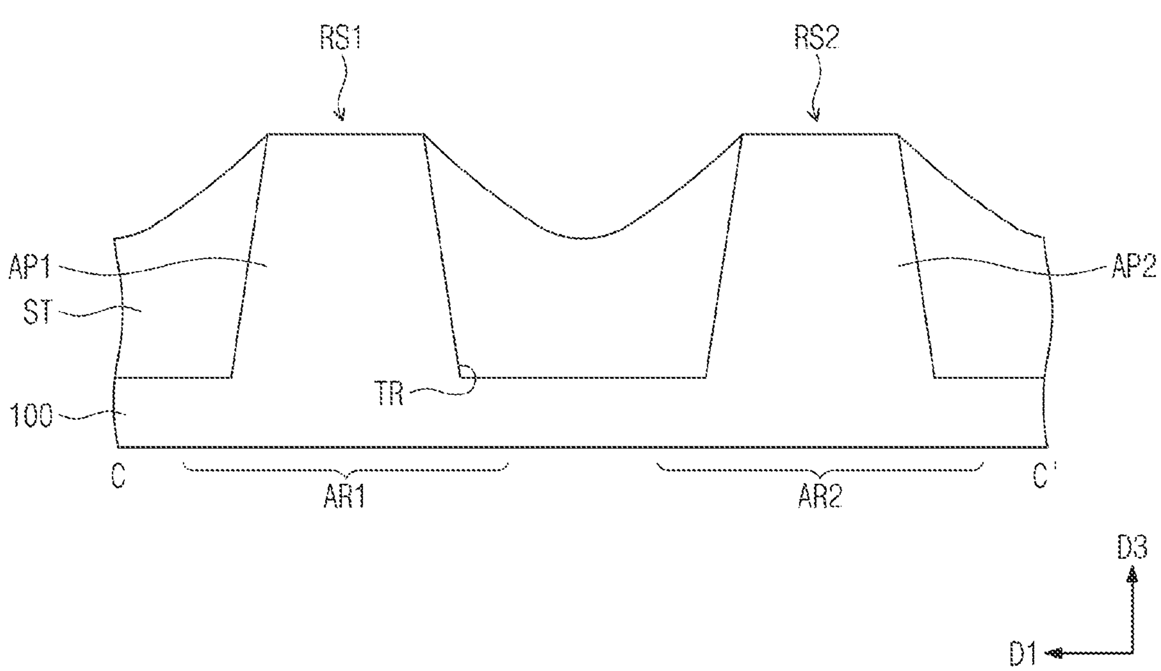

Referring to FIGS. 9A, 9B and 9C, first recesses RS1 may be formed in the stacked pattern STP on the first active pattern APE Second recesses RS2 may be formed in the stacked pattern STP on the second active pattern AP2. While the first and second recesses RS1 and RS2 are formed, the device isolation layer ST on both sides of each of the first and second active patterns AP1 and AP2 may be further recessed. (See, e.g., FIG. 9C).

Accordingly, the stacked pattern STP on the first active pattern AP1 may be etched using the hard mask patterns MA and the gate spacers GS as an etch mask to form the first recesses RS1. The first recess RS1 may be formed between the pair of sacrificial patterns PP.

The first to third semiconductor patterns SP1, SP2, and SP3 sequentially stacked between the first recesses RS1 adjacent may be formed from the active layers ACL, respectively. The first to third semiconductor patterns SP1, SP2, and SP3 between the first recesses RS1 adjacent may constitute a first channel pattern CH1.

Figure 13:
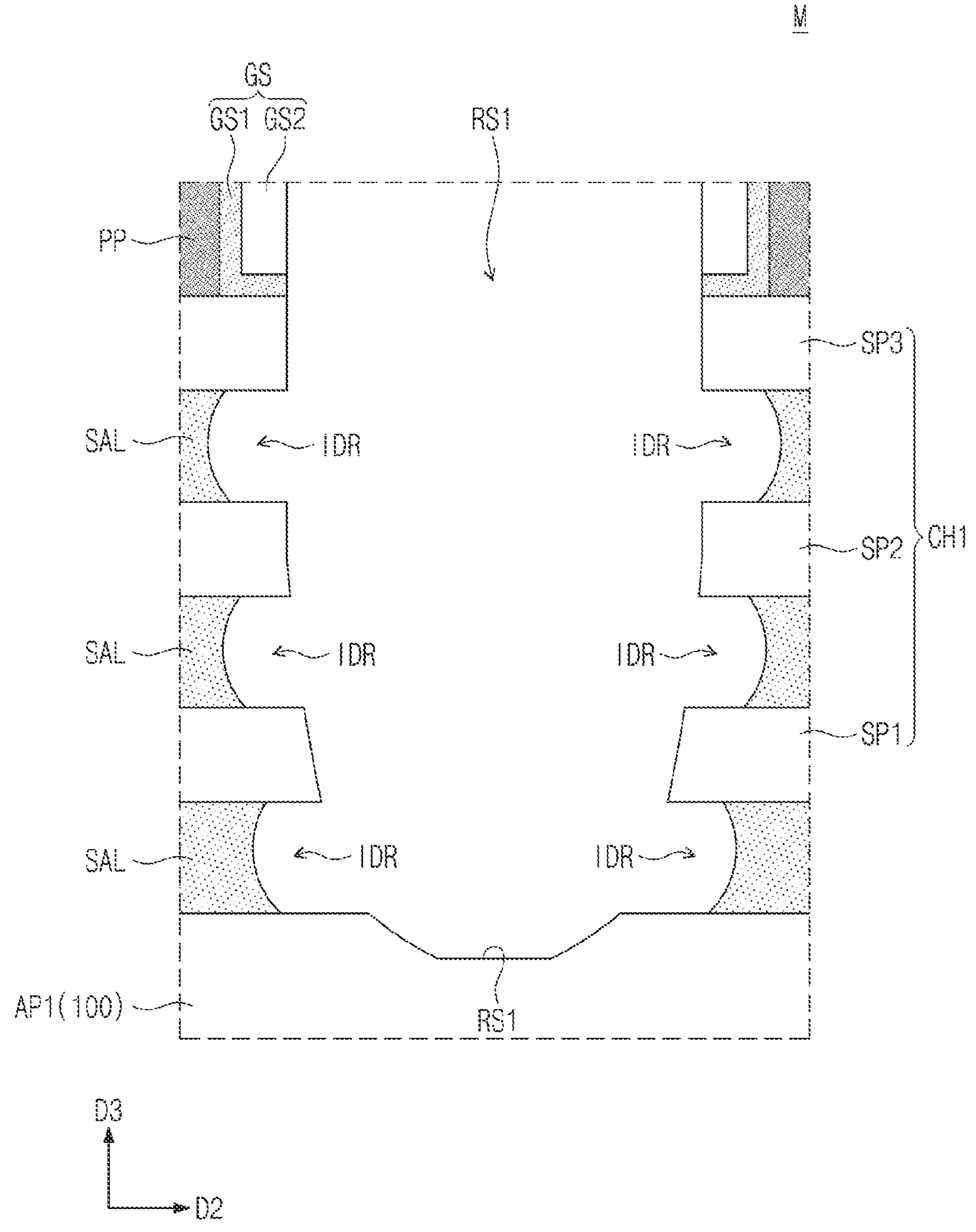
FIGS. 13, 14, and 15 are respective enlarged views illustrating method steps associated with the formation of the region 'M' indicated in FIG. 9A.
Figure 14:
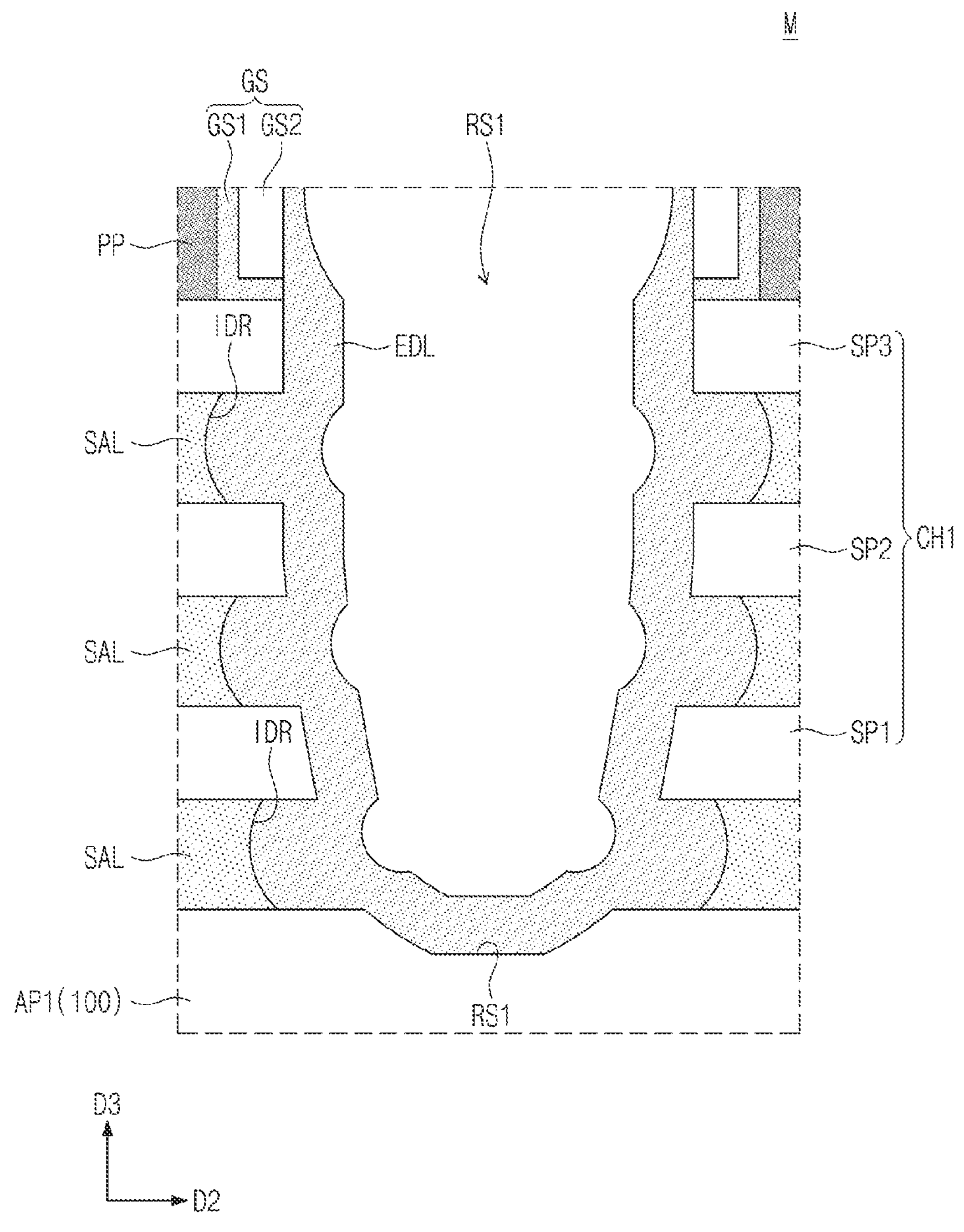
Figure 15:
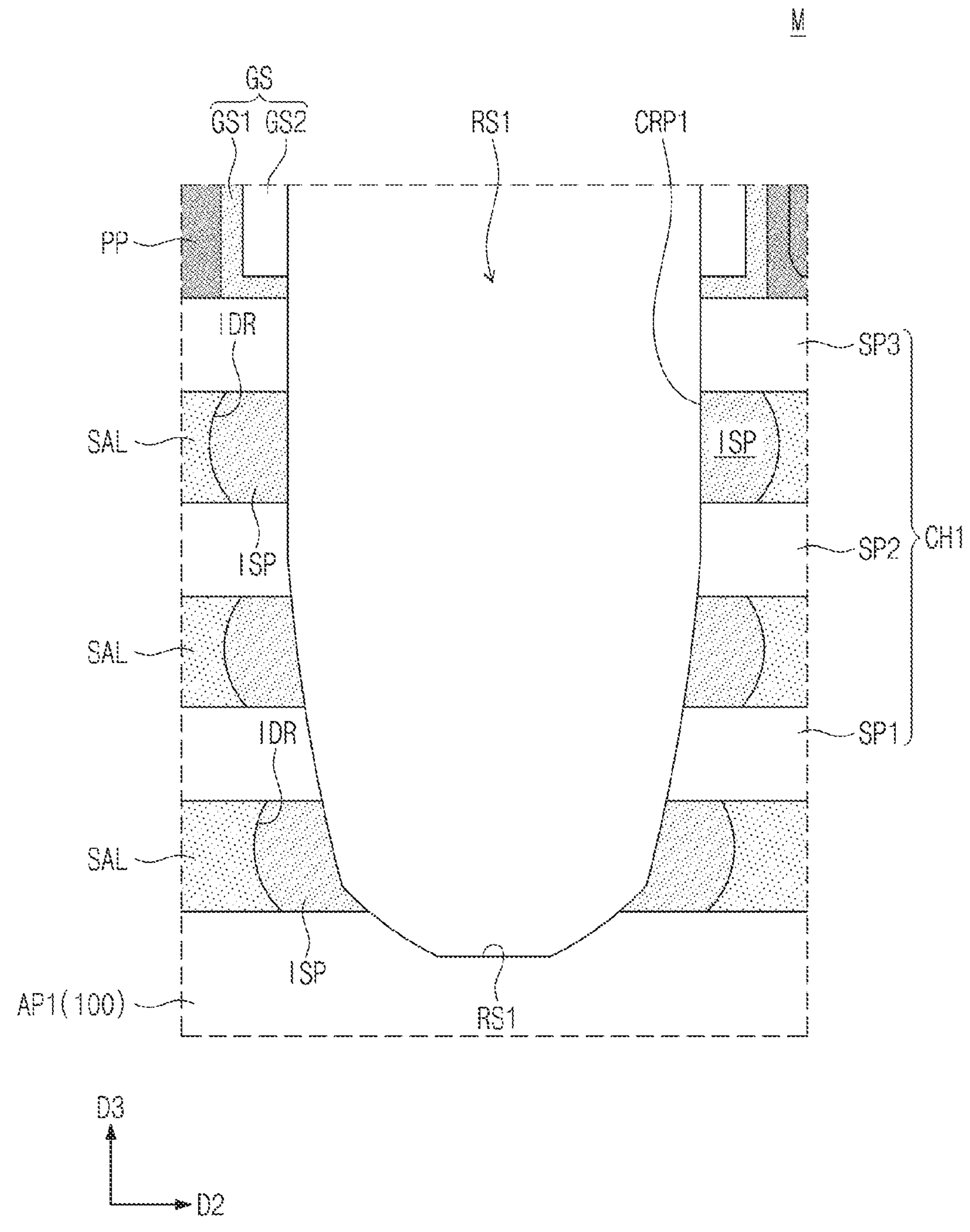

FIGS. 13, 14, and 15 are respective enlarged views of method steps that may be used to form the region (M) of FIG. 9A.

Referring to FIG. 13, the first recess RS1 may be formed between the adjacent sacrificial patterns PP. A width of the first recess RS1 in the second direction D2 may decrease as a distance to the substrate 100 decreases.

The sacrificial layers SAL may be exposed by the first recess RS1. A selective etching process may be performed on the exposed sacrificial layers SAL. The etching process may include a wet etching process for selectively removing only silicon-germanium. Each of the sacrificial layers SAL may be indented by the etching process to form an indent region IDR. The sidewall of the sacrificial layer SAL may be concave due to the indent region IDR.

Referring to FIG. 14, an epitaxial dielectric layer EDL may be formed in the first recess RS1 to fill the indent regions IDR. That is, the epitaxial dielectric layer EDL may be formed through an epitaxial growth process using an inner wall of the first recess RS1 as a seed.

The first to third semiconductor patterns SP1, SP2, and SP3 and the sacrificial layers SAL exposed by the first recess RS1 may be a seed layer of the epitaxial dielectric layer EDL. The epitaxial dielectric layer EDL may be grown as a crystalline dielectric layer on a crystalline semiconductor constituting the first to third semiconductor patterns SP1, SP2, and SP3 and the sacrificial layers SAL.

The epitaxial dielectric layer EDL may be formed of crystalline metal oxide expressed by the chemical formula MO, wherein (M) is a metal atom such as Mg, Be, and Ga. In some embodiments, the metal atom (M) in the formula (MO) may be selected from a group consisting of Mg, Be, and Ga.

The epitaxial dielectric layer EDL may have a lattice structure substantially the same as that of each of the first to third semiconductor patterns SP1, SP2, and SP3 and the sacrificial layers SAL. For example, the epitaxial dielectric layer EDL may be formed as a single crystal metal oxide in a face-centered cubic structure (FCC). A lattice constant of the metal oxide of the epitaxial dielectric layer EDL (or twice the lattice constant of the metal oxide) may range from about 4.2 Å to about 6.2 Å.

Referring to FIG. 15, the inner spacer ISP filling the indent region IDR may be formed. That is, forming the inner spacer ISP may include wet etching the epitaxial dielectric layer EDL until sidewalls of the first to third semiconductor patterns SP1, SP2, and SP3 are exposed. Accordingly, the epitaxial dielectric layer EDL may remain only in the indent region IDR to form the inner spacer ISP.

As the epitaxial dielectric layer EDL is a metal oxide, the epitaxial dielectric layer EDL may have an etch selectivity for the first to third semiconductor patterns SP1, SP2, SP3 and the gate spacers GS during the wet etching.

As a result, the first to third semiconductor patterns SP1, SP2, and SP3 (i.e., crystalline silicon) and the inner spacers ISP (i.e., crystalline metal oxide) may be exposed by the first recess RS1.

Referring to FIGS. 9A, 9B and 9C, the second recesses RS2 in the stacked pattern STP on the second active pattern AP2 may be formed in a manner similar to that of forming the first recesses RS1. A selective etching process may be performed on the sacrificial layers SAL exposed by the second recess RS2 to form indent regions IDE on the second active pattern AP2. Due to the indent regions IDE, the second recess RS2 may have a wavy inner wall. The inner spacers ISP may not be formed in the indent regions IDE on the second active pattern AP2. The first to third semiconductor patterns SP1, SP2, and SP3 between the second recesses RS2 adjacent may constitute a second channel pattern CH2.

Figure 10A:
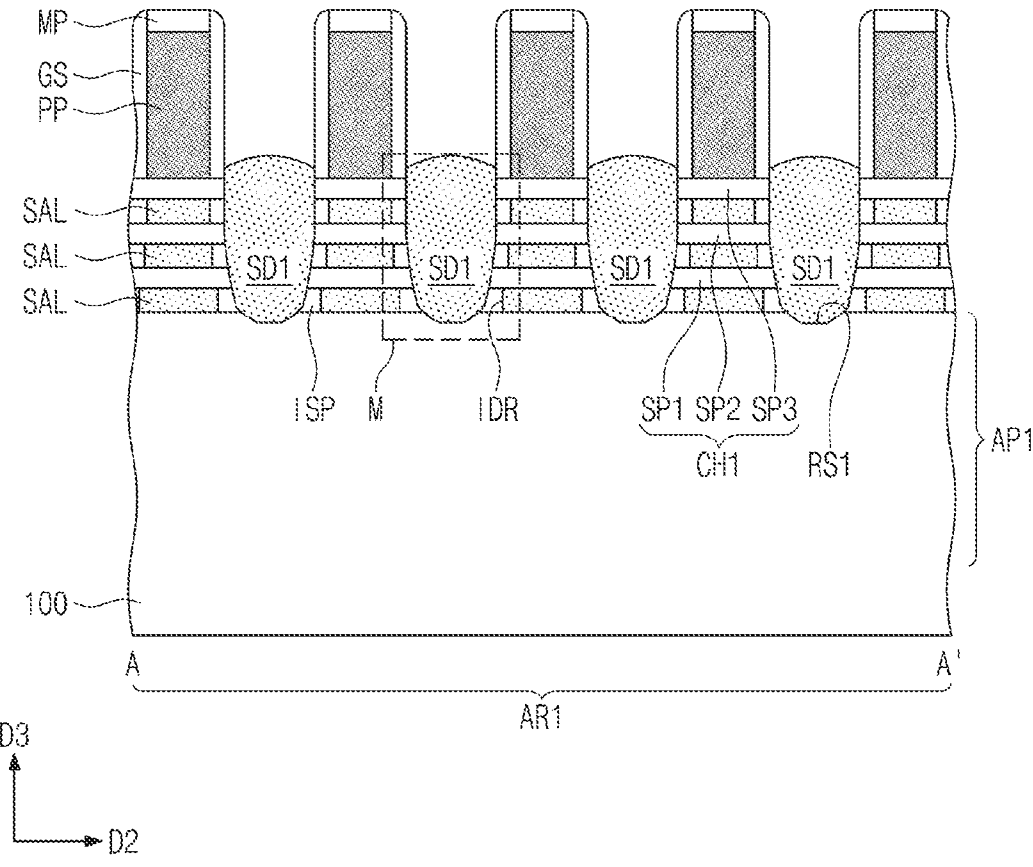
Figure 10B:
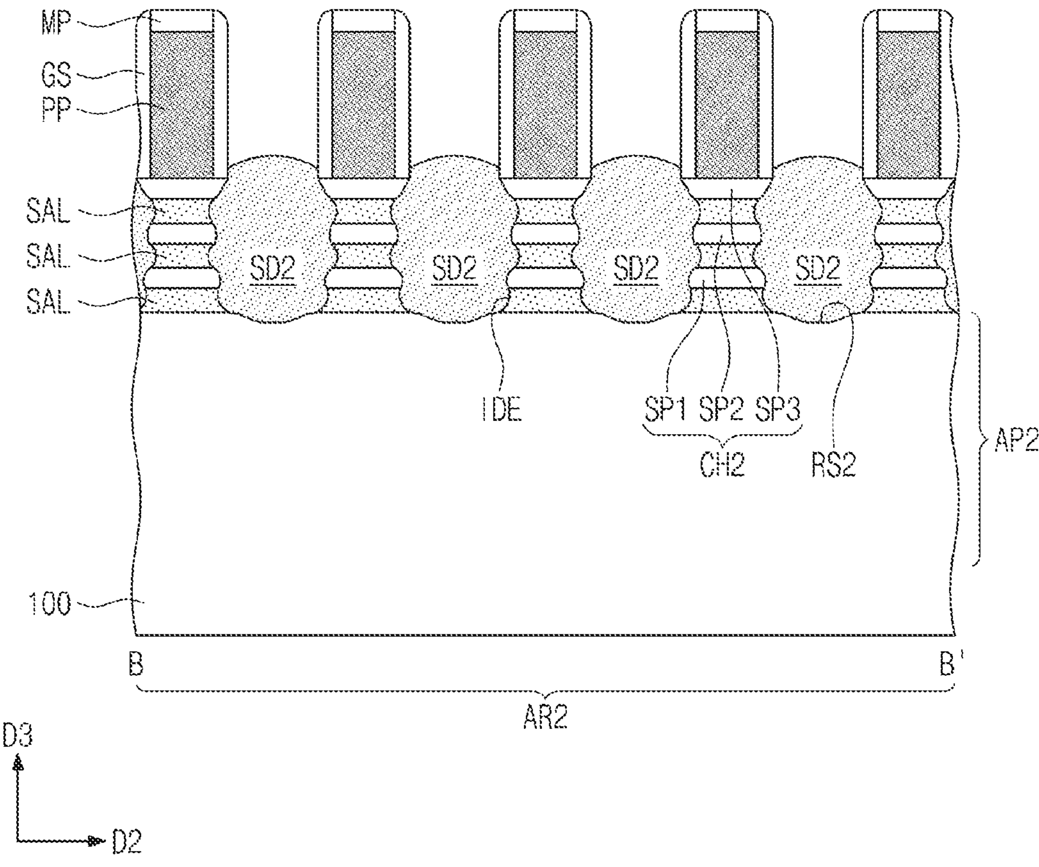
Figure 10C:
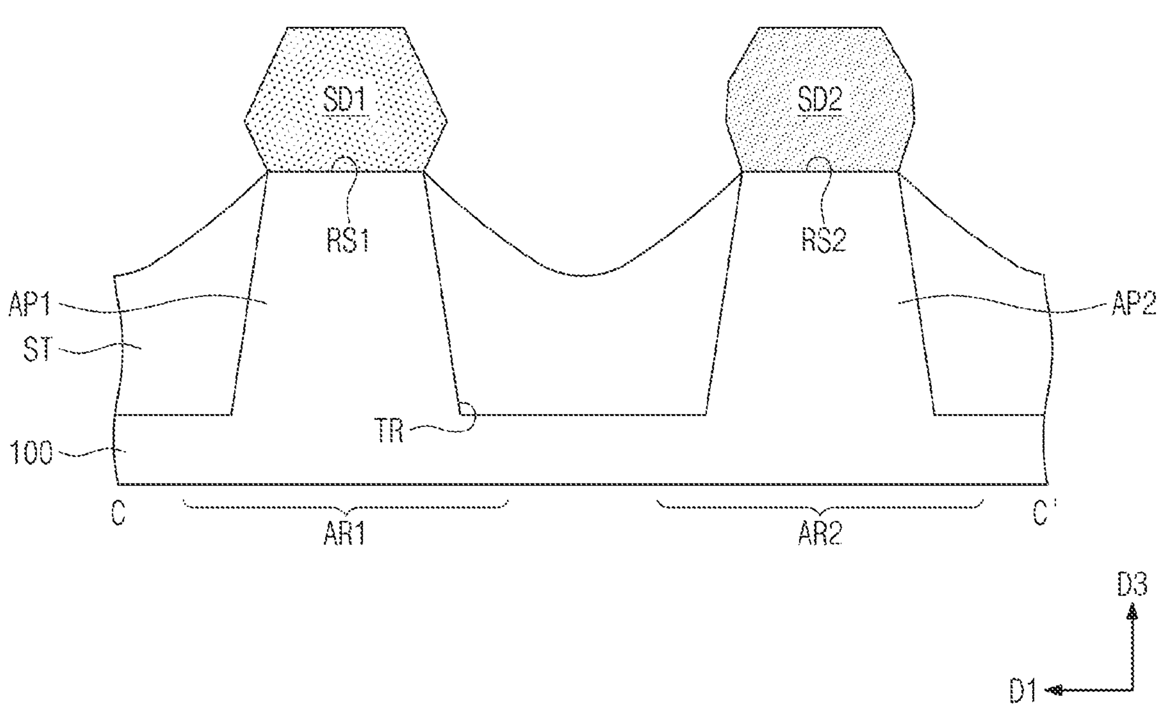

Referring to FIGS. 10A, 10B and 10C, first source/drain patterns SD1 may be respectively formed in the first recesses RS1. That is, an SEG process may be performed using the inner wall of the first recess RS1 as a seed layer to an epitaxial layer filling the first recess RS1. The epitaxial layer may be grown using the first to third semiconductor patterns SP1, SP2, and SP3, the inner spacers ISP, and the substrate 100 exposed by the first recess RS1, as seeds. Here, the SEG process may include, for example, a chemical vapor deposition (CVD) process or a molecular beam epitaxy (MBE) process.

In some embodiments, the first source/drain pattern SD1 may include the same semiconductor element (e.g., Si) as that of the substrate 100. While the first source/drain pattern SD1 is formed, impurities (e.g., phosphorus, arsenic, or antimony) that cause the first source/drain pattern SD1 to have an N-type may be implanted in-situ. Alternately, after the first source/drain pattern SD1 is formed, impurities may be implanted into the first source/drain pattern SD1.

Second source/drain patterns SD2 may be respectively formed in the second recesses RS2. That is, an SEG process may be performed using an inner wall of the second recess RS2 as a seed layer to form the second source/drain pattern SD2.

In some embodiments, the second source/drain pattern SD2 may include a semiconductor element (e.g., SiGe) having a lattice constant greater than a lattice constant of the semiconductor element of the substrate 100. While the second source/drain pattern SD2 is formed, impurities (e.g., boron, gallium, or indium) causing the second source/drain pattern SD2 to have a P-type conductivity may be implanted in-situ. Alternately, after the second source/drain pattern SD2 is formed, P-type impurities may be implanted into the second source/drain pattern SD2.

Figure 16:
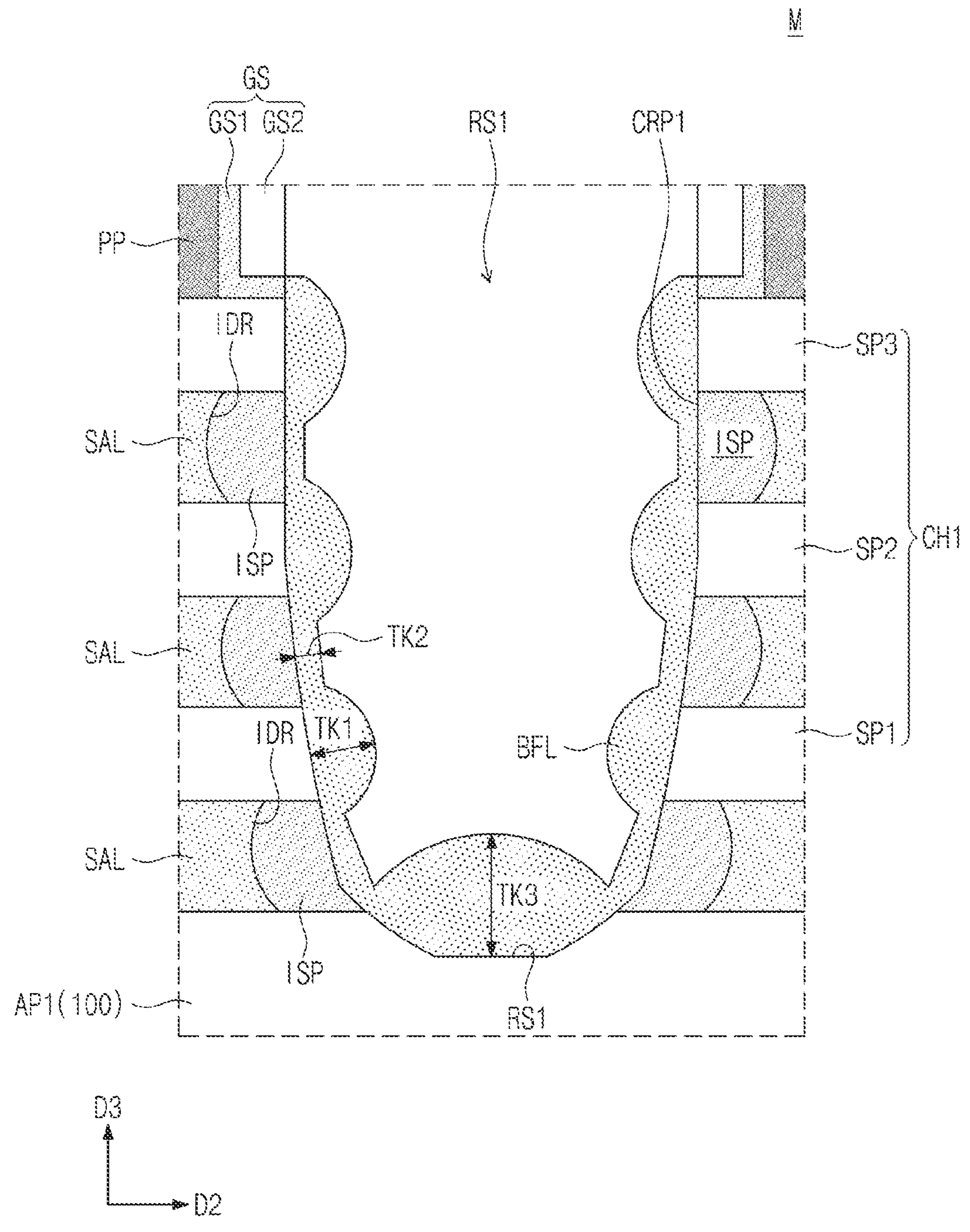
FIGS. 16 and 17 are enlarged views further illustrating method steps associated with the formation of the region 'M' indicated in FIG. 10A.
Figure 17:
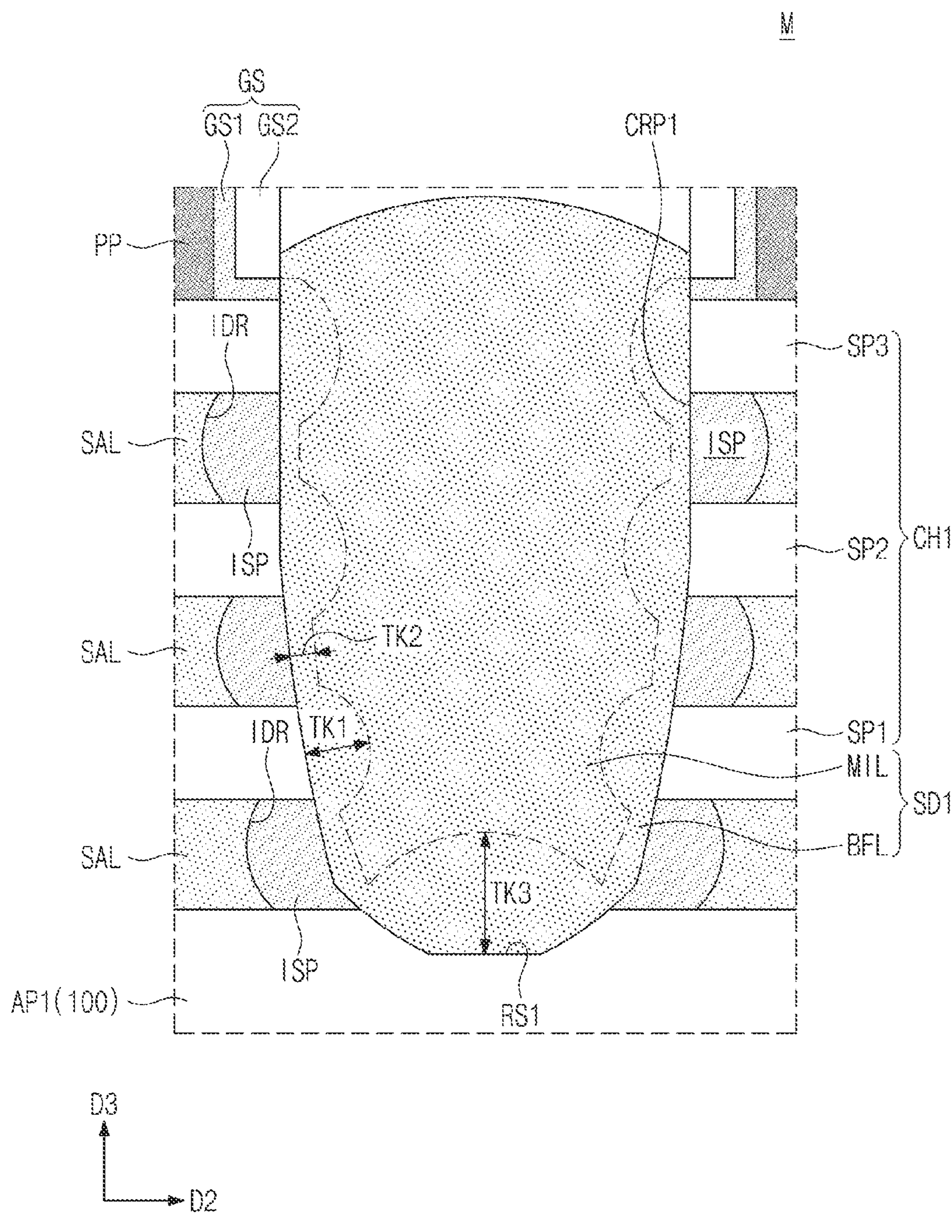

FIGS. 16 and 17 are enlarged views illustrating method steps that may be used to form the region 'M' indicated in FIG. 10A. Referring to FIG. 16, the first SEG may be performed using the first to third semiconductor patterns SP1 to SP3, the inner spacers ISP, and the first active pattern AP1 in the first recess RS1 as a seed layer. Accordingly, a buffer layer BFL may be grown in the first recess RS1. In some embodiments, when the buffer layer BFL is grown, arsenic (As) may be implanted in-situ.

The buffer layer BFL may be grown using not only single crystal silicon but also the inner spacer ISP, which is a crystalline dielectric, as a seed. Accordingly, as described above with reference to FIG. 6B, metal and oxygen atoms ((M) and (O)) of the inner spacer ISP and silicon atoms (Si) of the buffer layer BFL may be covalently bonded.

The buffer layer BFL grown on the semiconductor patterns SP1 to SP3 may have a first thickness TK1. The buffer layer BFL grown on the inner spacer ISP may have a second thickness TK2. The first thickness TK1 may be greater than the second thickness TK2. This is because a growth rate of the buffer layer BFL on the semiconductor patterns SP1 to SP3 is greater than a growth rate of the buffer layer BFL on the inner spacer ISP.

The buffer layer BFL grown on the bottom of the first recess RS1 may have a third thickness TK3. The third thickness TK3 may be greater than the first thickness TK1. This is because a growth rate of the buffer layer BFL in the third direction D3 is greater than a growth rate in either the first direction D1 or the second direction D2.

The buffer layer BFL may be continuously formed in the first recess RS1. That is, the buffer layer BFL may continuously extend from the bottom of the first recess RS1 to the third semiconductor pattern SP3 without interruption. The buffer layer BFL may cover not only the first to third semiconductor patterns SP1 to SP3 but also the inner spacers ISP.

Referring to FIG. 17, a second SEG process may be performed using the buffer layer BFL in the first recess RS1 as a seed layer. Accordingly, a main layer MIL filling the first recess RS1 may be formed. The second SEG process may be performed until the main layer MIL completely fills the first recess RS1. In some embodiments, when the main layer MIL is grown, phosphorus (P) may be implanted in-situ. However, a dose of phosphorus (P) may be adjusted to be higher than a dose of arsenic (As) in the first SEG.

Figure 18:
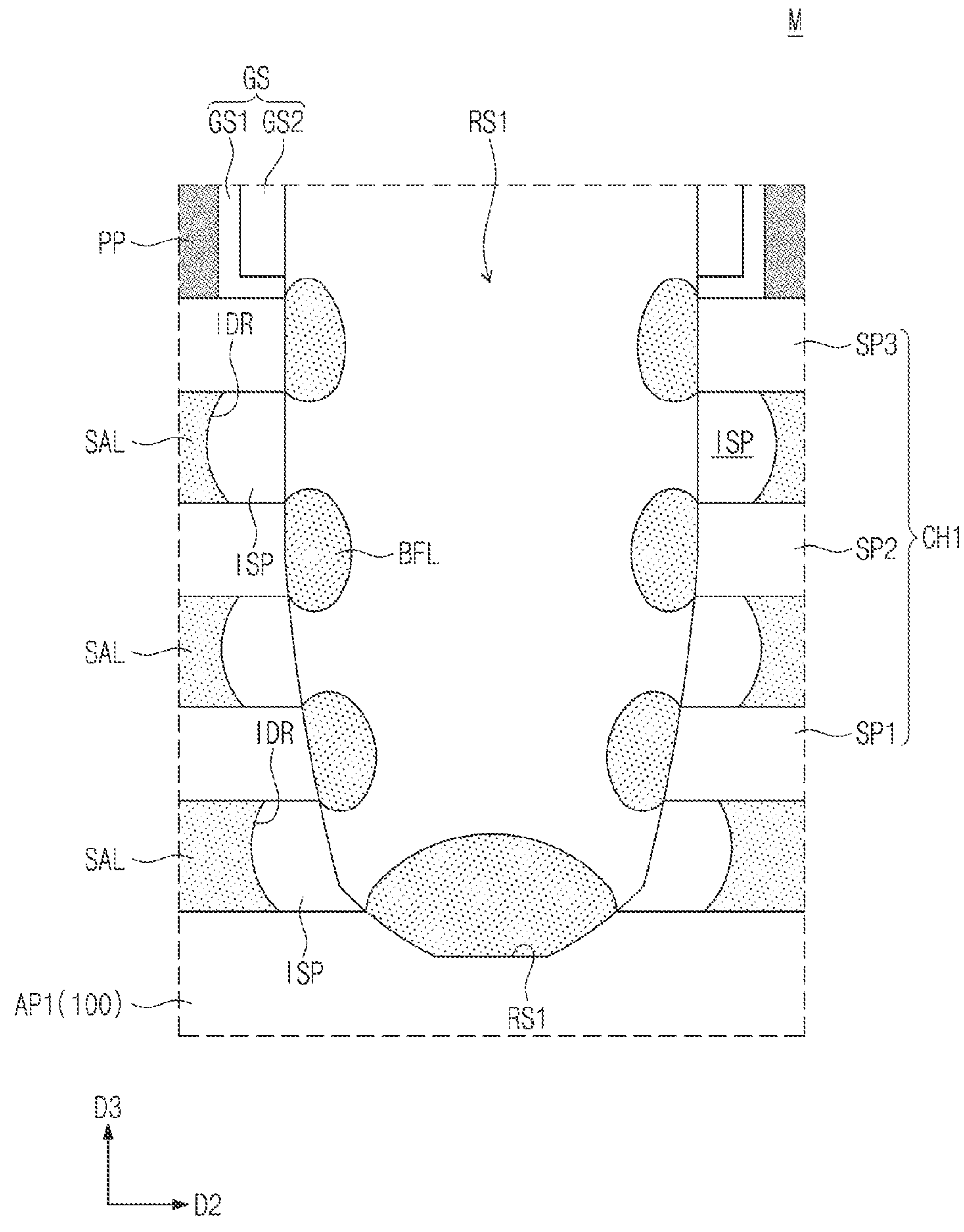
FIGS. 18 and 19 are enlarged views illustrating a comparative example related to method steps associated with the formation of the region 'M' indicated in FIG. 10A.
Figure 19:
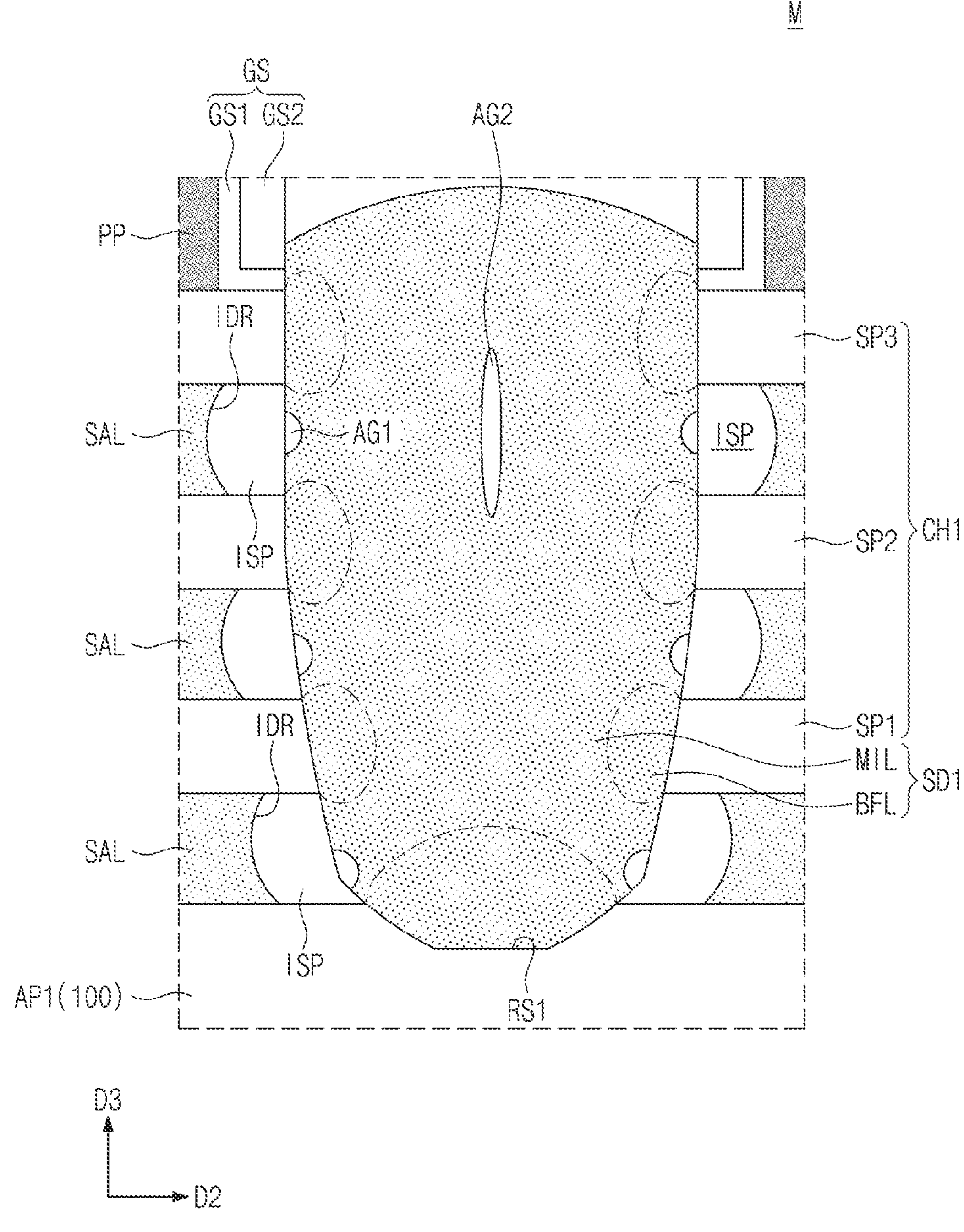

FIGS. 18 and 19 are respective enlarged views illustrating a comparative example of a method of manufacturing that maybe used to form the region 'M' indicated in FIG. 10A. Referring to FIG. 18, an inner spacers ISP may be formed of an amorphous dielectric. For example, the inner spacers ISP, like the gate spacers GS, may include an insulating material containing Si, for example, silicon nitride or silicon oxide.

A first SEG process may be performed in the first recess RS1 to form a buffer layer BFL. The buffer layer BFL according to the comparative example may be grown using the first to third semiconductor patterns SP1 to SP3 and the first active pattern AP1 as a seed layer. The inner spacer ISP of the comparative example is an amorphous dielectric and does not function as a seed layer. Accordingly, the buffer layer BFL cannot be grown on the inner spacer ISP.

Unlike the buffer layer BFL consistent with embodiments of the inventive concept (see, e.g., FIG. 16), the buffer layer BFL of FIGS. 18 and 19 may not be continuous in nature. That is, the buffer layer BFL may not continuously extend from the bottom of the first recess RS1 to the third semiconductor pattern SP3.

Referring to FIG. 19, a second SEG process may be performed using the buffer layer BFL in the first recess RS1 as a seed layer. The second SEG process may be performed until the main layer MIL completely fills the first recess RS1.

According to the comparative example, the main layer MIL may be grown on the non-continuous buffer layer BFL, and thus a first air gap AG1 may be formed between the main layer MIL and the inner spacer ISP. The first air gap AG1 may be a defect generated when the main layer MIL does not completely cover the surface of the inner spacer ISP.

According to the comparative example, the main layer MIL may be grown on the non-continuous buffer layer BFL, a second air gap AG2 may be formed in a center of the main layer MIL. The second air gap AG2 may also act as a defect in the first source/drain pattern SD1.

According to the comparative example, the main layer MIL may be grown while covering the surface of the amorphous inner spacer ISP, and thus lattice defects may be induced in the main layer MIL by the amorphous inner spacer ISP. This may also act as a defect in the first source/drain pattern SD1, thereby deteriorating electrical characteristics of the semiconductor device.

Alternately, according to embodiments of the inventive concept described above with reference to FIGS. 16 and 17, the inventive concept may use the crystalline inner spacer ISP instead of the amorphous inner spacer ISP of the comparative example. Accordingly, according to the inventive concept, the continuous and defect-free single crystal buffer layer BFL may be stably grown in the first recess RS1 through the first SEG process. By growing the main layer MIL on the continuous and defect-free single crystal buffer layer BFL, defects such as air gaps or lattice defects in the finally formed first source/drain pattern SD1 may be prevented. As a result, the method of manufacturing a semiconductor device according to the inventive concept may improve device reliability and ensure excellent electrical characteristics.

Figure 11A:
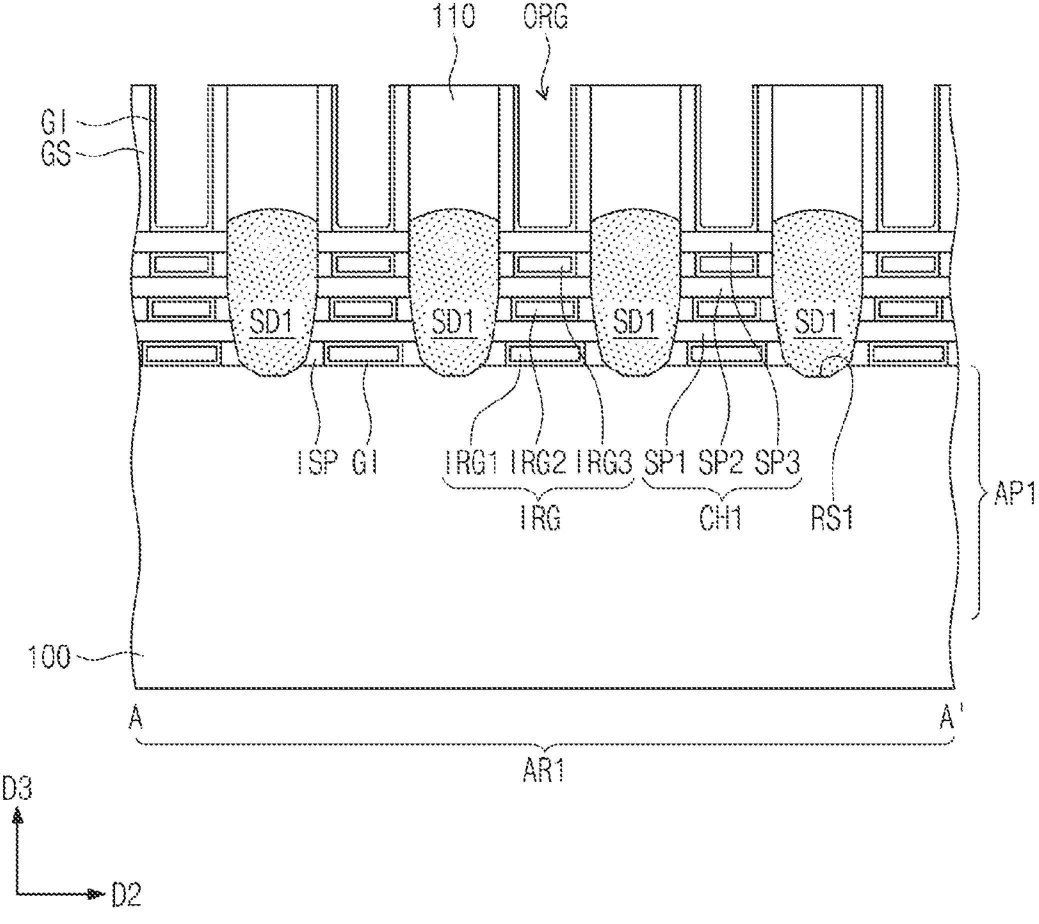
Figure 11B:
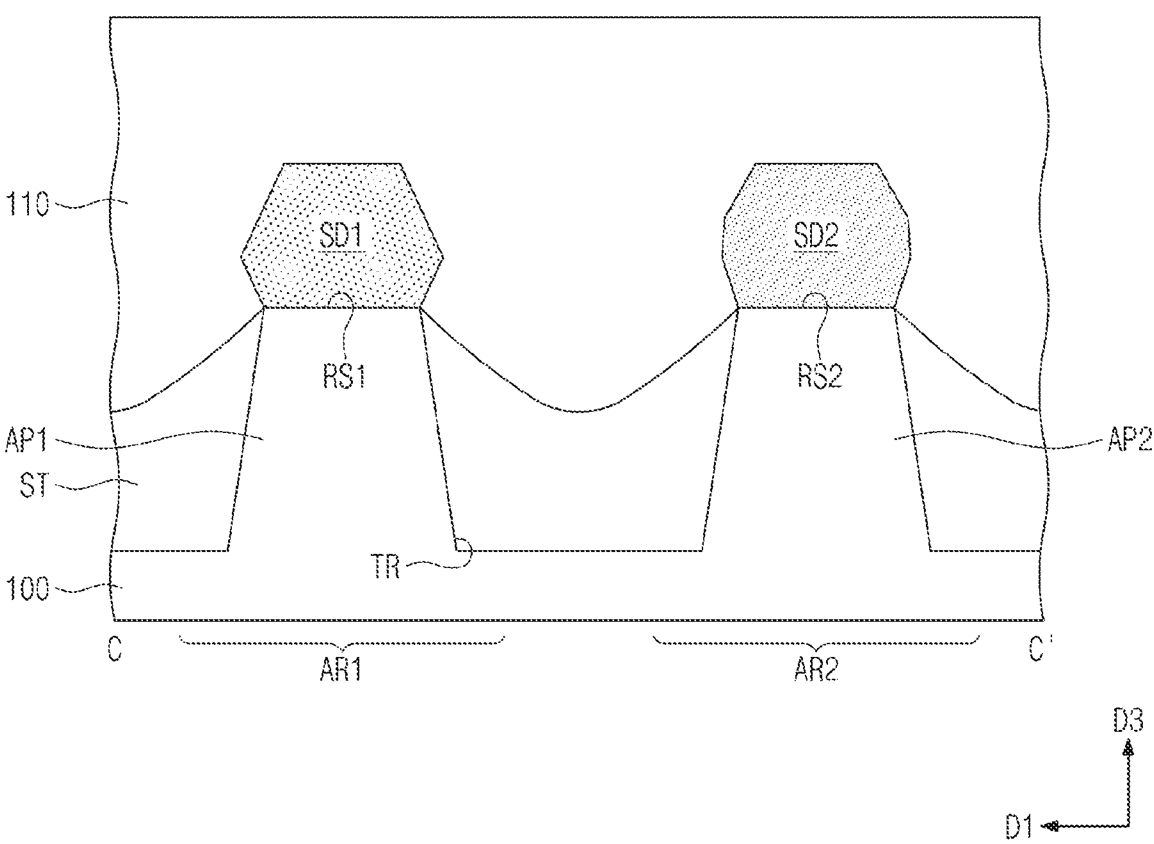
Figure 11C:
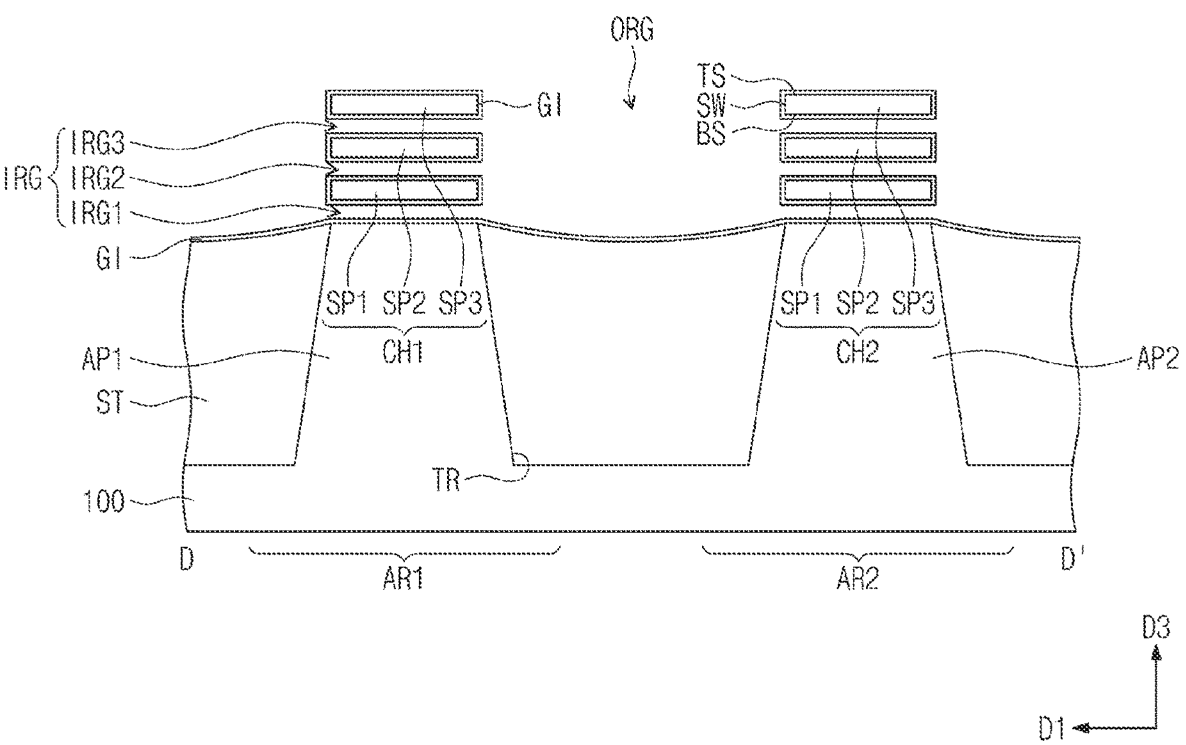

Referring to FIGS. 11A, 11B and 11C, a first interlayer insulating layer 110 covering the first and second source/drain patterns SD1 and SD2, the hard mask patterns MP, and the gate spacers GS may be formed. For example, the first interlayer insulating layer 110 may include a silicon oxide layer.

The first interlayer insulating layer 110 may be planarized until upper surfaces of the sacrificial patterns PP are exposed. The planarization of the first interlayer insulating layer 110 may be performed using an etch back process or a chemical mechanical polishing (CMP) process. During the planarization process, all of the hard mask patterns MP may be removed. As a result, an upper surface of the first interlayer insulating layer 110 may be coplanar with upper surfaces of the sacrificial patterns PP and upper surfaces of the gate spacers GS.

The exposed sacrificial patterns PP may be selectively removed. As the sacrificial patterns PP are removed, an outer region ORG exposing the first and second channel patterns CH1 and CH2 may be formed. (See, e.g., FIG. 11C). Removing the sacrificial patterns PP may include wet etching using an etchant that selectively etches polysilicon.

The sacrificial layers SAL exposed through the outer region ORG may be selectively removed to form inner regions IRG. (See, e.g., FIG. 11C). That is, an etching process of selectively etching the sacrificial layers SAL may be performed to remove only the sacrificial layers SAL while the first to third semiconductor patterns SP1, SP2, and SP3 remain as they are. The etching process may have a high etch rate with respect to silicon-germanium having a relatively high germanium concentration. For example, the etching process may have a high etching rate for silicon-germanium having a germanium concentration greater than 10 at %.

The sacrificial layers SAL on the first and second active regions AR1 and AR2 may be removed during the etching process. The etching process may be wet etching. The etching material used in the etching process may rapidly remove the sacrificial layer SAL having a relatively high germanium concentration.

Referring to FIG. 11C, as the sacrificial layers SAL are selectively removed, only the stacked first to third semiconductor patterns SP1, SP2, and SP3 may remain on each of the first and second active patterns AP1 and AP2. First to third inner regions IRG1, IRG2, and IRG3 may be respectively formed through regions from which the sacrificial layers SAL are removed.

The first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring to FIGS. 11A, 11B and 11C, a gate insulating layer GI may be formed on the exposed first to third semiconductor patterns SP1, SP2, and SP3. The gate insulating layer GI may be formed to surround each of the first to third semiconductor patterns SP1, SP2, and SP3. The gate insulating layer GI may be formed in each of the first to third inner regions IRG1, IRG2, and IRG3. The gate insulating layer GI may be formed in the outer region ORG.

Figure 12A:
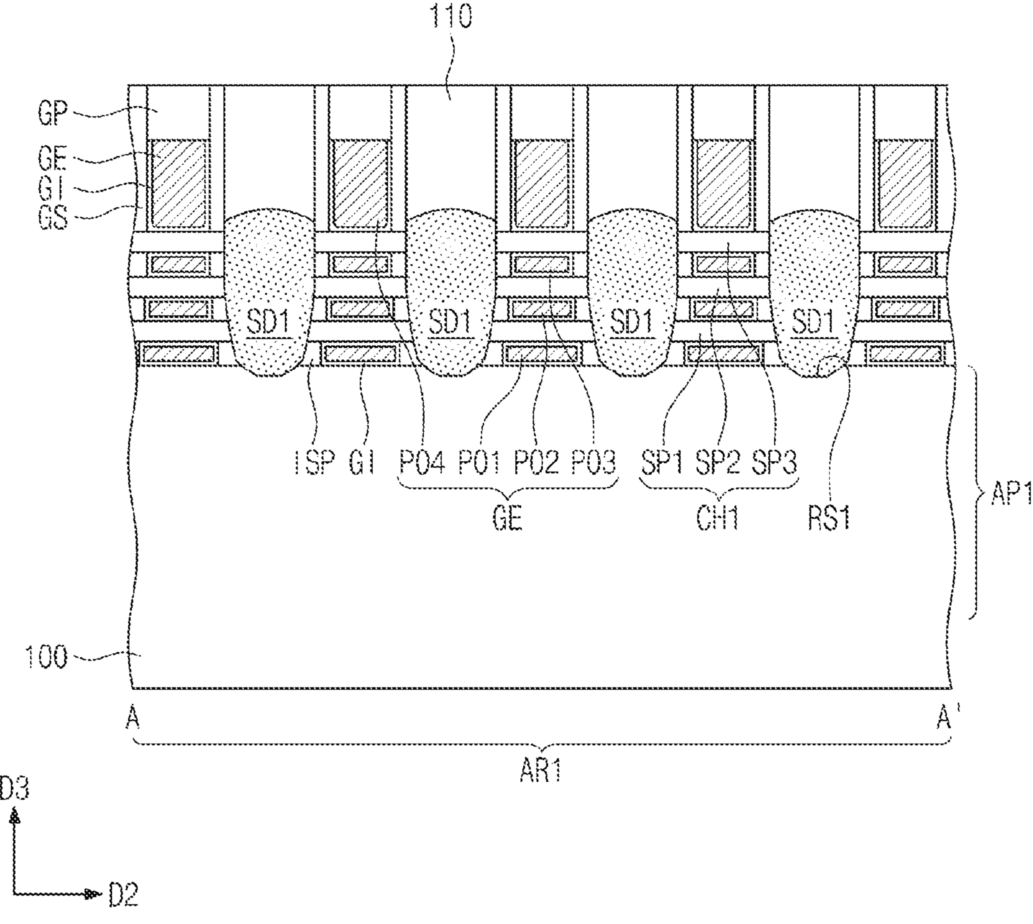
Figure 12B:
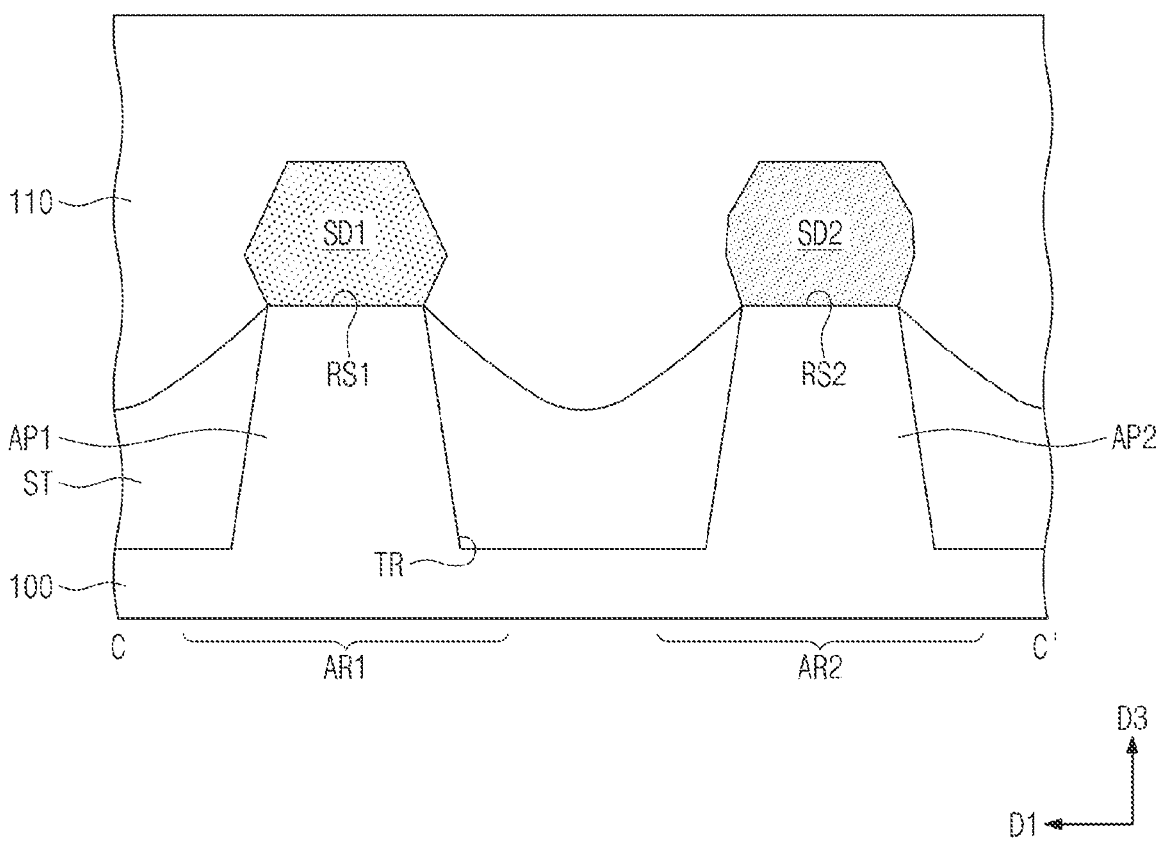
Figure 12C:
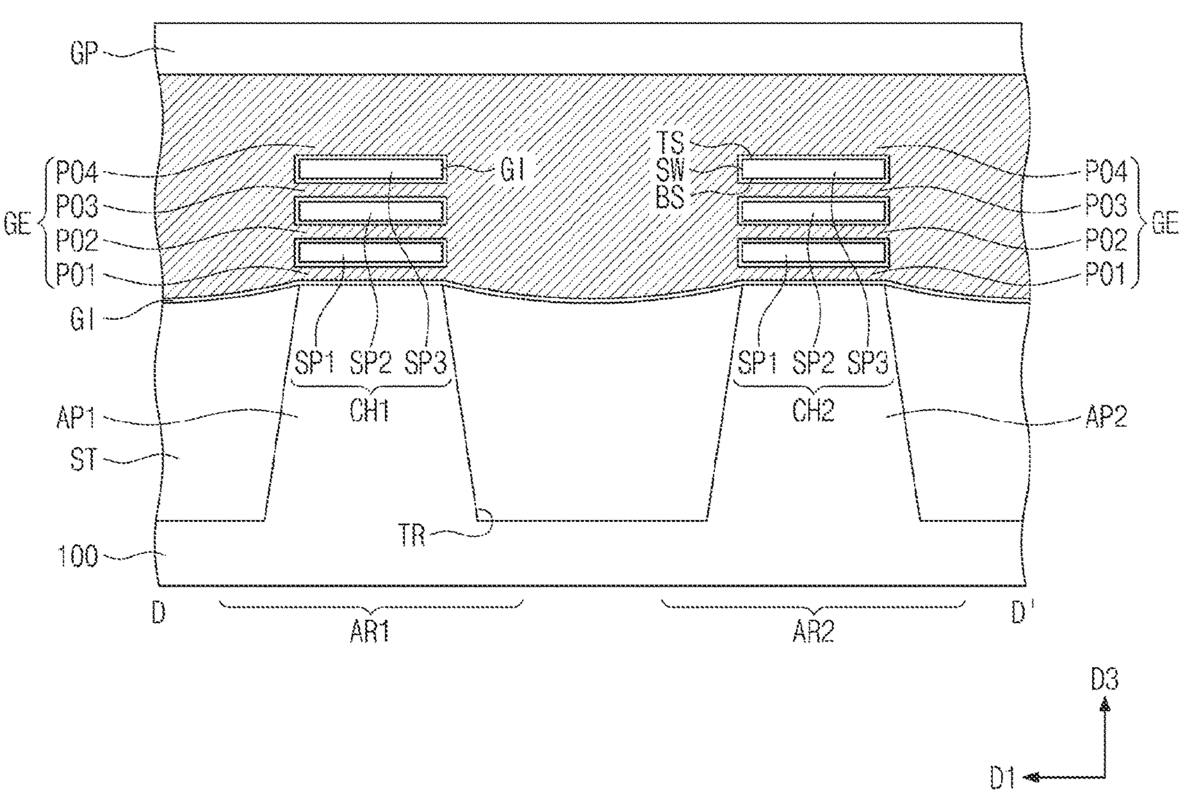

Referring to FIGS. 12A, 12B and 12C, a gate electrode GE may be formed on the gate insulating layer GI. The gate electrode GE may include first to third portions PO1, PO2, and PO3 respectively formed in the first to third inner regions IRG1, IRG2, and IRG3, and a fourth portion PO4 formed in the outer region ORG. The gate electrode GE may be recessed to reduce a height thereof. A gate capping pattern GP may be formed on the recessed gate electrode GE.

Referring to FIGS. 5A to 5D, a second interlayer insulating layer 120 may be formed on the first interlayer insulating layer 110. The second interlayer insulating layer 120 may include a silicon oxide layer. Active contacts AC electrically connected to the first and second source/drain patterns SD1 and SD2 may be formed through the second interlayer insulating layer 120 and the first interlayer insulating layer 110. A gate contact GC electrically connected to the gate electrode GE may be formed through the second interlayer insulating layer 120 and the gate capping pattern GP.

Forming each of the active contact AC and the gate contact GC may include forming a barrier pattern BM and forming a conductive pattern FM on the barrier pattern BM. The barrier pattern BM may be conformally formed and may include a metal layer/metal nitride layer. The conductive pattern FM may include a low-resistance metal.

Separation structures DB may be respectively formed on a first boundary BD1 and a second boundary BD2 of a single height cell SHC. The separation structure DB may extend into the active pattern AP1 or AP2 from the second interlayer insulating layer 120 through the gate electrode GE. The separation structure DB may include an insulating material such as a silicon oxide layer or a silicon nitride layer.

A third interlayer insulating layer 130 may be formed on the active contacts AC and the gate contacts GC. A first metal layer M1 may be formed in the third interlayer insulating layer 130. A fourth interlayer insulating layer 140 may be formed on the third interlayer insulating layer 130. A second metal layer M2 may be formed in the fourth interlayer insulating layer 140.

Figure 20:
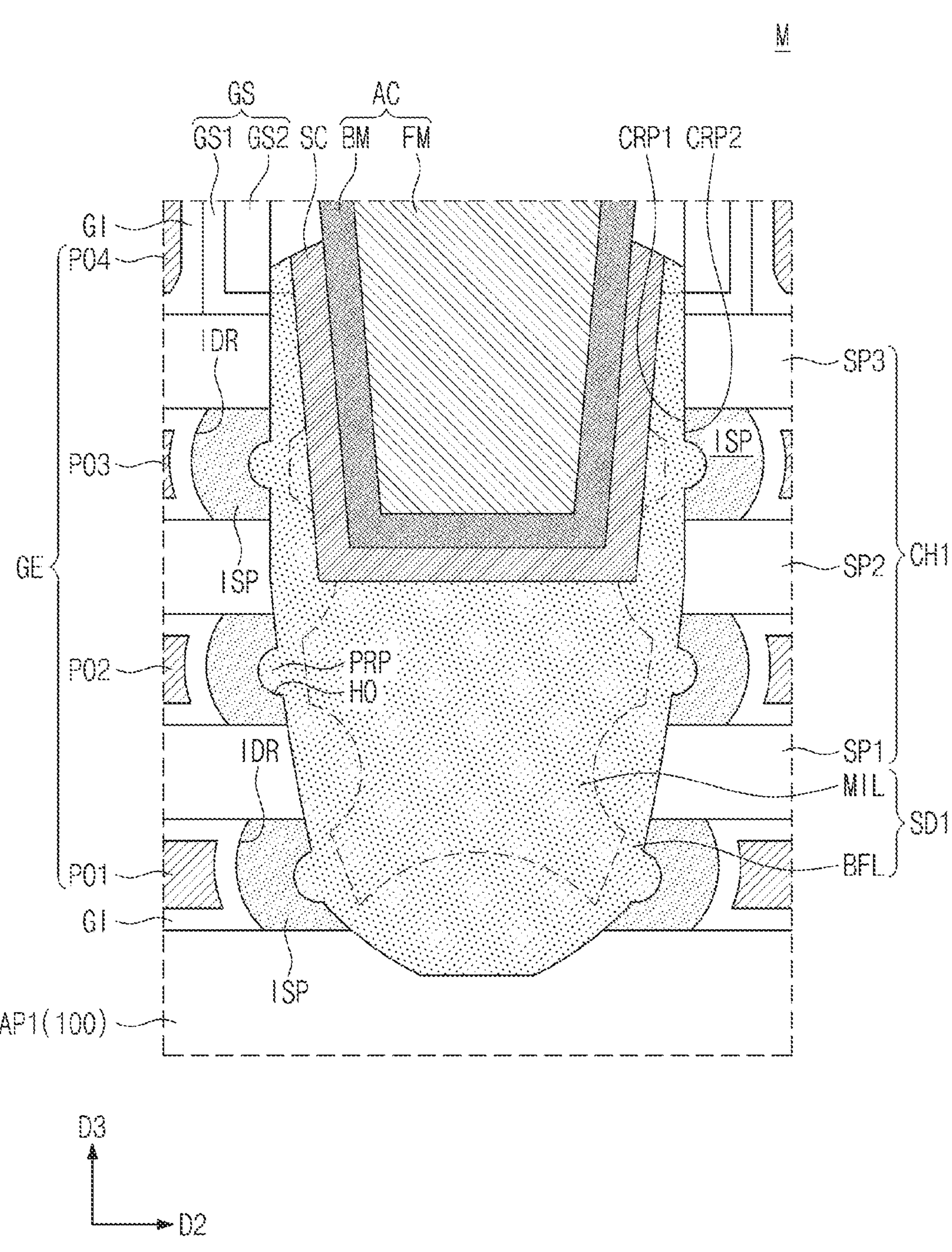
FIG. 20 is an enlarged view illustrating in another embodiment the portion 'M' indicated in FIG. 5A.

FIG. 20 is an enlarged view illustrating in another embodiment the region 'M' indicated in FIG. 5A.

Referring to FIG. 20, at least one inner spacer ISP may include a horizontally depressed hole HO. The hole HO may be depressed from the first crystal plane CRP1 toward the gate electrode GE. The hole HO may be formed by the wet etching process of the epitaxial dielectric layer EDL described above with reference to FIG. 15.

The first source/drain pattern SD1 may include a protrusion PRP filling the hole HO. The protrusion PRP may be in full contact with the hole HO. The protrusion PRP may completely fill the hole HO. This is because the first source/drain pattern SD1 is epitaxially grown using the inner spacer ISP as a seed, and thus the protrusion PRP completely filling the hole HO may be formed in the first source/drain pattern SD1.

When the inner spacer ISP is an amorphous dielectric, such as in the case of the comparative example noted above with reference to FIG. 18, the first air gap AG1 may be formed from the hole HO as shown in FIG. 19 to act a defect inside the first source/drain SD1.

From the foregoing those skilled in art will understand that three-dimensional field effect transistors according to embodiments of the inventive concept may prevent defects in the source/drain pattern by using the crystalline metal oxide as the inner spacer. Further, embodiments of the inventive concept provide the source/drain pattern free from the air gaps and the lattice defects, thereby improving the electrical characteristics and overall reliability of the semiconductor device.

While example embodiments of the inventive concepts have been particularly shown and described above, those skilled in the art will further understood that variations in form and detail may be made therein without departing from the scope of the inventive concept as defined by the following claims.

What is claimed is:

1. A semiconductor device comprising:

a substrate including an active pattern;

a channel pattern on the active pattern, the channel pattern including a plurality of spaced apart and vertically stacked semiconductor patterns;

a source/drain pattern connected to the plurality of semiconductor patterns;

a gate electrode on the plurality of semiconductor patterns, the gate electrode including a portion interposed between adjacent ones of the plurality of semiconductor patterns; and an inner spacer interposed between the portion of the gate electrode and the source/drain pattern, wherein the inner spacer comprises a first side surface facing the portion of the gate electrode and comprises a second side surface that is opposite the first side surface, wherein the second side surface contacts the source/drain pattern, wherein the second side surface comprises a first crystal plane configured to lattice match a second crystal plane of the source/drain pattern at an interface between the first crystal plane and the second crystal plane, and wherein the inner spacer is crystalline metal oxide and is expressed by a formula (MO), wherein (O) is an oxygen atom, and (M) is a metal atom selected from a group consisting of Mg, Be, and Ga, and wherein an atomic ratio of the oxygen atom (O) to the metal atom (M) is 1:1.

2. The semiconductor device of claim 1, wherein the metal atom (M) of the first crystal plane of the inner spacer and a silicon atom (Si) of the second crystal plane of the source/drain pattern are covalently bonded at the interface between the first crystal plane and the second crystal plane.

3. The semiconductor device of claim 1, wherein the oxygen atom (O) of the first crystal plane of the inner spacer and a silicon atom (Si) of the second crystal plane of the source/drain pattern are covalently bonded at the interface between the first crystal plane and the second crystal plane.

4. The semiconductor device of claim 1, wherein a lattice constant or twice the lattice constant of the crystalline metal oxide ranges from about 4.2 Å to about 6.2 Å.

5. The semiconductor device of claim 1, wherein the crystalline metal oxide has a band gap ranging from about 4 eV to about 20 eV.

6. The semiconductor device of claim 1, wherein the crystalline metal oxide has a dielectric constant ranging from about 6 to 10.

7. The semiconductor device of claim 1, wherein the crystalline metal oxide has a face-centered cubic structure (FCC).

8. The semiconductor device of claim 1, comprising:

a gate insulating layer interposed between the portion of the gate electrode and the first side surface of the inner spacer, wherein the gate insulating layer covers the first side surface of the inner spacer, and wherein the source/drain pattern covers the second side surface of the inner spacer.

9. A semiconductor device comprising:

a substrate including an active pattern;

a channel pattern on the active pattern, wherein the channel pattern includes a plurality of semiconductor patterns;

a source/drain pattern connected to the plurality of semiconductor patterns;

a gate electrode on the plurality of semiconductor patterns, wherein the gate electrode includes a portion interposed between adjacent ones of the plurality of semiconductor patterns; and an inner spacer comprising a first side surface facing the portion of the gate electrode and comprising a second side surface opposite the first side surface, wherein the second side surface includes a first crystal plane contacting a second crystal plane of the source/drain pattern, wherein the inner spacer includes crystalline metal oxide and is expressed by a formula (MO), wherein (O) is an oxygen atom, and (M) is a metal atom selected from a group consisting of Mg, Be, and Ga, wherein the metal atom (M) of the first crystal plane of the inner spacer and a silicon atom of the second crystal plane of the source/drain pattern are covalently bonded at an interface between the first crystal plane of the inner spacer and the second crystal plane of the source/drain pattern, wherein the first crystal plane is configured to lattice match the second crystal plane at the interface between the first crystal plane and the second crystal plane, and wherein an atomic ratio of the oxygen atom (O) to the metal atom (M) is 1:1.

10. The semiconductor device of claim 9, wherein an oxygen atom of the first crystal plane of the inner spacer and the silicon atom of the second crystal plane of the source/drain pattern are covalently bonded at the interface between the first crystal plane and the second crystal plane.

11. The semiconductor device of claim 9, wherein the crystalline metal oxide has a band gap ranging from about 4 eV to about 20 eV.

12. The semiconductor device of claim 9, wherein the crystalline metal oxide has a dielectric constant ranging from about 6 to 10.

13. A semiconductor device comprising:

a substrate including an active region;

a device isolation layer defining an active pattern on the active region;

a channel pattern and a source/drain pattern on the active pattern, the channel pattern including a plurality of semiconductor patterns;

a gate electrode on the plurality of semiconductor patterns, the gate electrode including a portion interposed between adjacent semiconductor patterns among the plurality of semiconductor patterns;

a gate insulating layer between the adjacent semiconductor patterns and the portion of the gate electrode;

an inner spacer between the gate insulating layer and the source/drain pattern;

a gate spacer on a sidewall of the gate electrode;

a gate capping pattern on an upper surface of the gate electrode;

an interlayer insulating layer on the gate capping pattern;

an active contact electrically connected to the source/drain pattern through the interlayer insulating layer;

a metal-semiconductor compound layer interposed between the active contact and the source/drain pattern;

a gate contact passing through the interlayer insulating layer and the gate capping pattern to be electrically connected to the gate electrode;

a first metal layer on the interlayer insulating layer, the first metal layer including a power wiring, and first wirings electrically connected to the active contact and the gate contact, respectively; and a second metal layer on the first metal layer, wherein the second metal layer includes second wirings electrically connected to the first metal layer, wherein the inner spacer includes crystalline metal oxide of a face-centered cubic structure (FCC), wherein the inner spacer comprises a first side surface facing the gate insulating layer and comprises a second side surface opposite the first side surface, wherein the second side surface contacts the source/drain pattern, wherein the inner spacer includes crystalline metal oxide and is expressed by a formula (MO), wherein (O) is an oxygen atom, and (M) is a metal atom selected from a group consisting of Mg, Be, and Ga, wherein the second side surface comprises a first crystal plane configured to lattice match a second crystal plane of the source/drain pattern at an interface between the first crystal plane and the second crystal plane, and wherein an atomic ratio of the oxygen atom (O) to the metal atom (M) is 1:1.

14. The semiconductor device of claim 13, wherein the source/drain pattern includes single-crystal silicon of a face-centered cubic structure (FCC).

15. The semiconductor device of claim 13, wherein a metal atom of the first crystal plane of the inner spacer and a silicon atom of the second crystal plane of the source/drain pattern are covalently bonded at the interface between the first crystal plane and the second crystal plane.

16. The semiconductor device of claim 13, wherein an oxygen atom of the first crystal plane of the inner spacer and a silicon atom of the second crystal plane of the source/drain pattern are covalently bonded at the interface between the first crystal plane and the second crystal plane.

* * * * *